(12) United States Patent
Hayashi

(10) Patent No.: US 6,433,513 B1
(45) Date of Patent: Aug. 13, 2002

(54) METHOD, APPARATUS AND COMPUTER READABLE RECORDED MEDIUM FOR SECONDARY BATTERY LIFE EVALUATION

(75) Inventor: Katsutoshi Hayashi, Tokyo (JP)

(73) Assignee: NEC Infrontia Corporation, Kawasaki (JP)

( * ) Notice: Subject to any disclaimer, the term of this patent is extended or adjusted under 35 U.S.C. 154(b) by 158 days.

(21) Appl. No.: 09/650,159

(22) Filed: Aug. 28, 2000

(30) Foreign Application Priority Data

Aug. 30, 1999 (JP) .......................................... 11-243827

(51) Int. Cl.$^7$ ................................................ H02J 7/14
(52) U.S. Cl. ...................................... 320/132; 320/134
(58) Field of Search .............................. 324/427, 426, 324/433; 320/132, 134, 136

(56) References Cited

U.S. PATENT DOCUMENTS 5,614,804 A * 3/1997 Kayano et al. ............. 320/134
5,955,869 A * 9/1999 Rathmann ................... 320/132

FOREIGN PATENT DOCUMENTS

| JP | 3-17966 | 1/1991 |
| JP | 7-201370 | 8/1995 |
| JP | 7-230344 | 8/1995 |
| JP | 8/140289 | 5/1996 |
| JP | 9-22741 | 1/1997 |

* cited by examiner

Primary Examiner—Gregory Toatley
(74) Attorney, Agent, or Firm—McGinn & Gibb, PLLC

(57) ABSTRACT

A method and an apparatus for accurately determining the service life of a secondary battery are provided. If a the battery 14 is re-charged after each discharge, various values of an index related to pre-measured degradation of a fully charged secondary battery 14 are stored in a flash read-only-memory FROM 34 so that they may be compared with discharged amounts of the battery 14. The duration of discharge is obtained by a timing circuit 24, and the discharged amount is computed by the control circuit 26. A value of the index is obtained by referring to FROM 34 using the computed value of discharged power. The service life remaining after the current use is computed by the control circuit 26, according to the maximum service life of the battery 14 and various values of the index obtained after each use of the battery including the current use, and the end of service life of the battery 14 is determined according to whether the computed service life is longer or shorter than a pre-determined threshold value.

18 Claims, 20 Drawing Sheets

FIG.7

| DISCHARGED AMOUNT \ CHARGED AMOUNT | $A_1$ | $A_2$ | $\cdots$ | $A_n$ |
|---|---|---|---|---|
| $B_1$ | $L_{11}$ | $L_{12}$ | $\cdots$ | $L_{1n}$ |
| $B_2$ | $L_{21}$ | $L_{22}$ | | |
| $\vdots$ | $\vdots$ | | | |
| $B_n$ | $L_{n1}$ | | | $L_{nn}$ |

FIG.11

| DISCHARGED AMOUNT | BACKUP-ABLE TIME |
|---|---|
| $B_1$ | $T_1$ |
| $B_2$ | $T_2$ |
| ⋮ | ⋮ |
| $B_n$ | $T_n$ |

FIG.17

| | CHARGED AMOUNT | | | |
|---|---|---|---|---|
| DISCHARGED AMOUNT | $A_1$ | $A_2$ | $\cdots$ | $A_n$ |
| $B_1$ | $T_{11}$ | $T_{12}$ | $\cdots$ | $T_{1n}$ |
| $B_2$ | $T_{21}$ | $T_{22}$ | | |
| $\vdots$ | $\vdots$ | | | |
| $B_n$ | $T_{n1}$ | | $\cdots\cdots$ | $T_{nn}$ |

METHOD, APPARATUS AND COMPUTER READABLE RECORDED MEDIUM FOR SECONDARY BATTERY LIFE EVALUATION

BACKGROUND OF THE INVENTION

1. Field of the Invention

The present invention relates to a method and an apparatus for evaluating the service life of a secondary battery and a computer-readable recorded medium containing a program for executing a secondary battery evaluation process.

2. Description of the Related Art

Secondary batteries are used as a power source in information processing devices and portable information processing terminals with or without the charging section. Because such secondary batteries have a finite service life depending on the of type of battery, it is essential to be able to forecast the service life so that service interruption would not be experienced. For portable information devices and personal computers based on volatile memory, it is especially important to maintain a full power source because the power failure leads to a loss of information stored in the volatile memory.

An example of battery life evaluation apparatuses for evaluating the service life of batteries is disclosed in a Japanese Patent Application, First Publication, Hei7-201370.

This apparatus is designed to evaluate the service life of a battery by recording charging data, such as charging current, charging time, voltage at charge startup, voltage at charge completion and the number of charges performed, in a charging data storage section 1, and recording the basic operating parameters of the secondary battery in a basic parameter storage section 2, and the stored data in the charge data storage section 1 and the basis parameter storage section 2 are sent to and compared in an evaluation section 3.

Another example of battery life evaluation apparatus is disclosed in a Japanese Patent Application, First Publication, Hei7-17966.

This apparatus evaluates service life of storage batteries installed in vehicles, and is designed to evaluate a storage battery 1 in an electric car. In this apparatus, battery usage data such as properties of the battery 1, conditions of usage, historical data and others are recorded in RAM 8-6, and for evaluation of battery life, the battery 1 is removed from the car and is connected to an external computer, with an intervening interface circuit 8-5, which analyzes the recorded chronological usage data together with the historical data recorded in RAM 8-6 through the interface circuit 8-5. The apparatus is then returned to the electric car, and at suitable intervals, the data recorded in RAM 8-6 (such as battery properties, conditions of usage, historical data and others) are accessed and compared with real-time data obtained by way of the interface circuit 8-6 so as to evaluate the extent of degradation experienced by the storage battery 1, in other words, to evaluate the remaining service life of the battery 1.

Therefore, in both of these apparatuses that are disclosed, evaluation is performed according to chronological historical data of secondary battery or storage battery.

However, in both of these battery life evaluation apparatuses, although the service life is supposed to be evaluated according to chronological historical data, many of the essential factors necessary for accurate evaluation of secondary batteries and storage batteries are not being considered in evaluating the service life of the secondary batteries and storage batteries, resulting that accurate determination of battery service life cannot be obtained.

SUMMARY OF THE INVENTION

It is an object of the present invention to provide a method and an apparatus for providing accurate data on service life and useable time remaining in a secondary battery for use in portable terminal devices, and to provide a recorded medium containing service life evaluation program for a secondary battery.

To resolve the problems outline above, the present invention provides a first aspect of the invention in a method for determining a service life of a secondary battery subjected to repeated charging/discharging cycles; comprising the steps of: storing, in a memory device, pre-measured values of an index related to decrements in service life of the battery, which is fully charged after each discharge event during a charging/discharging cycle, to correspond to discharged amounts produced during charging/discharging cycles experienced by the battery during the respective charging/discharging cycles; computing a discharged amount after each charging/discharging cycle; obtaining an index to correspond to the discharged amount from the memory device; computing a service life remaining after the current cycle of charging/discharging according to a maximum service life of the battery and the values of the index obtained in individual charging/discharging cycles, including the current charging/discharging cycle; and determining whether or not the remaining service life computed is less than a pre-determined reference value, and deeming that the battery has reached an end of the service life when the computed value is less than the reference value.

A second aspect of the invention relates to a method for determining a service life of a secondary subjected to repeated charging and discharging processes, comprising the steps of: storing, in a memory device, pre-measured values of an index related to decrements in service life of the battery and various amounts of charges and discharges produced in charging/discharging cycles corresponding to the charged and discharged amounts experienced by the battery during the respective charging/discharging cycles; computing a charged amount and a discharged amount after each cycle of charging/discharging; obtaining an index to correspond to the computed charged amount and the computed discharged amount with reference to the memory device; computing a service life remaining after the current cycle of charging/discharging according to a maximum service life of the battery and the values of the index obtained in individual charging/discharging cycles, including the current charging/discharging cycle; and determining whether or not the remaining service life computed is less than a pre-determined reference value, and deeming that the battery has reached an end of the service life when the computed service life is less than the reference value.

A third aspect of the invention relates to a method for determining a useable time for one additional use, after a current cycle of charging/discharging of a secondary battery subjected to repeated cycles of charging/discharging, comprising the steps of: computing a service life of the battery remaining after the current cycle of charging/discharging of the battery; computing an average amount of consumed service life by dividing a cumulative value of consumed service life of individual cycles from a first cycle to the current cycle of charging/discharging by a number of cycles of charging/discharging; computing an average use time of the battery from the first cycle to the current cycle; and computing a useable time for one additional use of the battery after the current cycle of charging/discharging, according to the remaining service life computed, the average amount of consumed service life, and the average use time of the battery.

A fourth aspect of the invention relates to the method according to claim 3, wherein the remaining service life of the battery is obtained by subtracting a cumulative consumed service life including the current cycle of charging/discharging from the maximum service life of the battery.

A fifth aspect of the invention relates to the method according to claim 3 or 4, wherein the remaining service life of the battery is obtained by: storing, in a memory device, pre-measured values of an index related to decrements in service life of the battery, which is fully charged after each discharge event during a charging/discharging cycle, to correspond to discharged amounts produced during charging/discharging cycles experienced by the battery during the respective charging/discharging cycles; computing a first cumulative discharged amount from individual cycles of charging/discharging including a preceding cycle of charging/discharging of the battery; obtaining a value of the index with reference to the memory device to correspond to the first cumulative discharged amount from individual cycles of charging/discharging including the preceding cycle; computing a first service life of the battery remaining after the preceding cycle of charging/discharging, according to the maximum service life of the battery and the values of the index obtained from individual cycles of charging/discharging including the preceding cycle of charging/discharging of the battery; computing a second cumulative discharged amount from individual cycles of charging/discharging including a current cycle of charging/discharging of the battery; obtaining another value of the index with reference to the memory device to correspond to the second cumulative discharged amount from individual cycles of charging/discharging including the current cycle; computing a second service life of the battery remaining after the current cycle of charging/discharging, according to the maximum service life of the battery and the values of the index obtained from individual cycles of charging/discharging including the current cycle of charging/discharging of the battery; and obtaining the remaining service life of the battery by subtracting the first cumulative service life from the second cumulative service life.

A sixth aspect of the invention relates to the method according to claim 5 or 6, wherein the remaining service life of the battery is obtained by: storing, in a memory device, pre-measured values of an index related to decrements in service life of the battery and various amounts of charges and discharges produced in charging/discharging cycles corresponding to the charged and discharged amounts experienced by the battery during the respective charging/discharging cycles; computing a charged amount and a discharged amount after each cycle of charging/discharging; computing a first cumulative charged amount and a first cumulative discharged amount from individual cycles of charging/discharging including a preceding cycle of charging/discharging of the battery; obtaining an index with reference to the memory device to correspond to the first cumulative charged amount and the first cumulative discharged amount from individual cycles of charging/discharging including the preceding cycle; computing a first service life of the battery remaining after the preceding cycle of charging/discharging, according to the maximum service life of the battery and the values of the index obtained from individual cycles of charging/discharging including the preceding cycle of charging/discharging of the battery; computing a second cumulative charged amount and the second cumulative discharged amount from individual cycles of charging/discharging including a current cycle of charging/discharging of the battery; obtaining an index with reference to the memory device to correspond to the second cumulative charged amount and the second cumulative discharged amount from individual cycles of charging/discharging including the current cycle; computing a second service life of the battery remaining after the current cycle of charging/discharging, according to the maximum service life of the battery and the values of the index obtained for individual cycles of charging/discharging including the current cycle of charging/discharging of the battery; and obtaining the remaining service life of the battery by subtracting the first service life from the second service life.

A seventh aspect of the invention relates to an apparatus for determining a service life of a secondary battery subjected to repeated cycles of charging/discharging of the battery, comprising: first memory unit storing, in a memory device, pre-measured values of an index related to decrements in service life of the battery, which is fully charged after each discharge event during a charging/discharging cycle, to correspond to discharged amounts produced during charging/discharging cycles experienced by the battery during the respective charging/discharging cycles; first discharged amount computation unit which computes a discharged amount for each cycle of charging/discharging; first index obtaining unit which obtains an index to correspond to a discharged amount computed by the first discharged amount computation unit with reference to the first memory unit; computing a service life remaining after the current cycle of charging/discharging according to a maximum service life of the battery and the values of the index obtained in individual charging/discharging cycles, including the index obtained in the current charging/discharging cycle; and first determination unit which determines whether or not the remaining service life computed is less than a pre-determined reference value, and deeming that the battery has reached an end of the service life when the computed service life is less than the reference value.

An eighth aspect of the invention relates to an apparatus for determining a service life of a secondary battery subjected to repeated cycles of charging/discharging of the battery, comprising: second memory unit which stores, in a memory device, pre-measured values of an index related to decrements in service life of the battery and various amounts of charges and discharges produced in charging/discharging cycles corresponding to the charged and discharged amounts experienced by the battery during the respective charging/discharging cycles; computing a charged amount and a discharged amount after each cycle of charging/discharging; first charged/discharged amount computation unit which computes a charged amount and a discharged amount for each cycle of charging/discharging; second index obtaining unit which obtains an index to correspond to a charged amount and a discharged amount computed by the first charged/discharged amount computation unit with reference to the second memory unit; second service life computation unit which computes a remaining service life of the battery after the current cycle of charging/discharging according to the maximum service life of the battery and the index obtained by the second index obtaining unit from individual cycles of charging/discharging including current cycle of charging/discharging; and second determination unit which determines whether or not the remaining service life computed is less than a pre-determined reference value, and deeming that the battery has reached an end of the service life when the computed service life is less than the reference value.

A ninth aspect of the invention relates to an apparatus for determining a useable time for one additional use, after a current cycle of charging/discharging of a secondary battery subjected to repeated cycles of charging/discharging, comprising: service life computation unit which computes a service life of the battery remaining after the current cycle of charging/discharging of the battery; average service life computation unit which computes an average amount of consumed service life by dividing a cumulative value of consumed service life of individual cycles from a first cycle to the current cycle of charging/discharging by a number of cycles of charging/discharging; average use time computing unit which computes an average use time of the battery from the first cycle to the current cycle; and useable time computation unit which computes a useable time for one additional use of the battery after the current cycle of charging/discharging, according to the remaining service life computed, the average amount of consumed service life, and the average use time of the battery.

A tenth aspect of the invention relates to the apparatus according to claim 9, wherein the remaining service life computed by the remaining service life computation unit is obtained by subtracting from the maximum service life of the battery a cumulative consumed service life in individual cycles of charging/discharging from the first use to the current use.

An eleventh aspect of the invention relates to the apparatus according to claim 9 or 10, wherein the service life decrement computation unit comprises: third memory unit which stores, in a memory device, pre-measured values of an index related to decrements in service life of the battery, which is fully charged after each discharge event during a charging/discharging cycle, to correspond to discharged amounts produced during charging/discharging cycles experienced by the battery during the respective charging/discharging cycles; second discharged amount computation unit which computes a discharged amount for each cycle of charging/discharging; third index obtaining unit which obtains an index to correspond to a discharged amount computed by the second discharged amount computation unit with reference to the third memory unit; and first differential outputting unit which outputs a difference between a service life remaining in the battery after the preceding cycle of charging/discharging computed according to the maximum service life of the battery and the values of the index obtained by the third index obtaining unit for individual cycles of charging/discharging including the preceding cycle of discharge, on the one hand, and a service life remaining in the battery after the current cycle of charging/discharging computed according to the maximum service life of the battery and the values of the index obtained by the third index obtaining unit for individual cycles of charging/discharging including the current cycle of discharge, on the other.

A twelfth aspect of the invention relates to the useable time computation apparatus according claim 9 or 10, wherein the service life decrement computation unit comprises: fourth memory unit which stores pre-measured values of an index related to decrements in service life of the battery and various amounts of charges and discharges produced in charging/discharging cycles corresponding to the charged and discharged amounts experienced by the battery during the respective charging/ discharging cycles; computing a charged amount and a discharged amount after each cycle of charging/discharging; second discharged amount computation unit which computes a discharged amount for each cycle of charging/discharging; fourth index obtaining unit which obtains an index to correspond to a discharged amount computed by the second discharged amount computation unit with reference to the fourth memory unit; and second differential outputting unit which outputs a difference between a service life remaining in the battery after the preceding cycle of charging/discharging computed according to the maximum service life of the battery and the values of the index obtained by the fourth index obtaining unit for individual cycles of charging/discharging including the preceding cycle of discharge, on the one hand, and a service life remaining in the battery after the current cycle of charging/discharging computed according to the maximum service life of the battery and the values of the index obtained by the fourth index obtaining unit for individual cycles of charging/discharging including the current cycle of discharge, on the other.

A final aspect of the invention relates to a computer-readable recorded medium containing a program for determining a service life of a secondary battery according to an aspect of the invention disclosed in claims 1, 2, 3, 7, 8, and 9.

Accordingly, because the service life of the battery is evaluated by following a process, in which a discharged amount is computed each time the secondary battery used, a service life degradation index is obtained to correspond to the discharged amount computed, so that the service life can be computed according to the maximum life of the battery and the values of the degradation index obtained for each prior uses of the battery to the current use, and the service life of the battery is determined according to whether the computed service life is longer or shorter than a reference value, and therefore, the method enables to evaluate the service life of the battery without raising the cost of the portable terminal, thereby enabling to more accurately forecast the remaining life of the spare battery.

Also, because the service life of the battery is evaluated by following the process, in which the amounts of charges and discharges preceding the current use are computed each time the secondary battery used, a service life degradation index is obtained to correspond to the computed charged and discharged amounts, so that a service life after the current use can be computed according to the maximum life of the battery and the values of the degradation index obtained for each prior uses of the battery, and the service life of the battery is determined according to whether the computed service life is longer or shorter than a reference value, and therefore, the method enables to evaluate the service life of the battery, thereby enabling to more accurately forecast the remaining life of the spare battery.

Also, because the service life of the battery is evaluated by following the process, in which service life of the battery remaining including the current use, the average consumed service life including the current use and the average use time including the current use are computed, and a useable time remaining after the current use is reported according to the computed values of the remaining service life, average consumed service life and average use time, thereby enabling to report the useable time remaining in the battery after each use of the battery.

Therefore, it is possible to report the service life as well as the useable time of the battery so that the loss of important information contained in the volatile memory in the portable terminal, caused by inattention to the life of the spare battery, can be prevented even more completely, thereby contributing significantly to maintain smooth operation of the portable information processing device.

BRIEF DESCRIPTION OF THE DRAWINGS

FIG. 7 is a table of secondary battery properties used in the secondary battery life evaluation apparatus.

FIG. 11 is a table of secondary battery properties used in the secondary battery life evaluation apparatus.

FIG. 17 is a table of secondary battery properties used in the secondary battery life evaluation apparatus.

DESCRIPTION OF THE PREFERRED EMBODIMENTS

Preferred embodiments will be presented in the following with reference to the drawings. Explanations are provided specifically with reference to the embodiments.

First Embodiment

Figure 1:
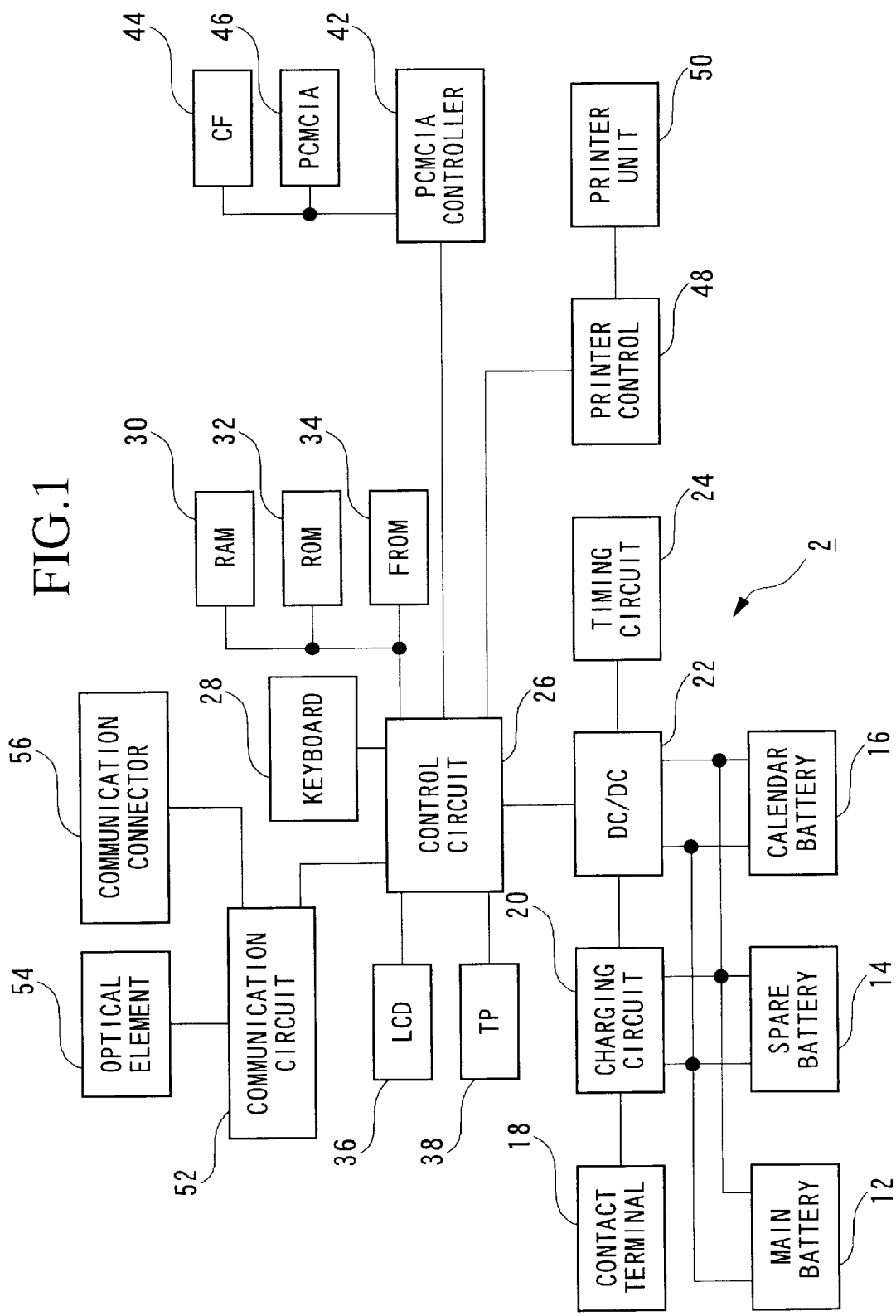
FIG. 1 is a block diagram of the electrical configuration of the secondary battery life evaluation apparatus in a first embodiment of the present invention.
Figure 2:
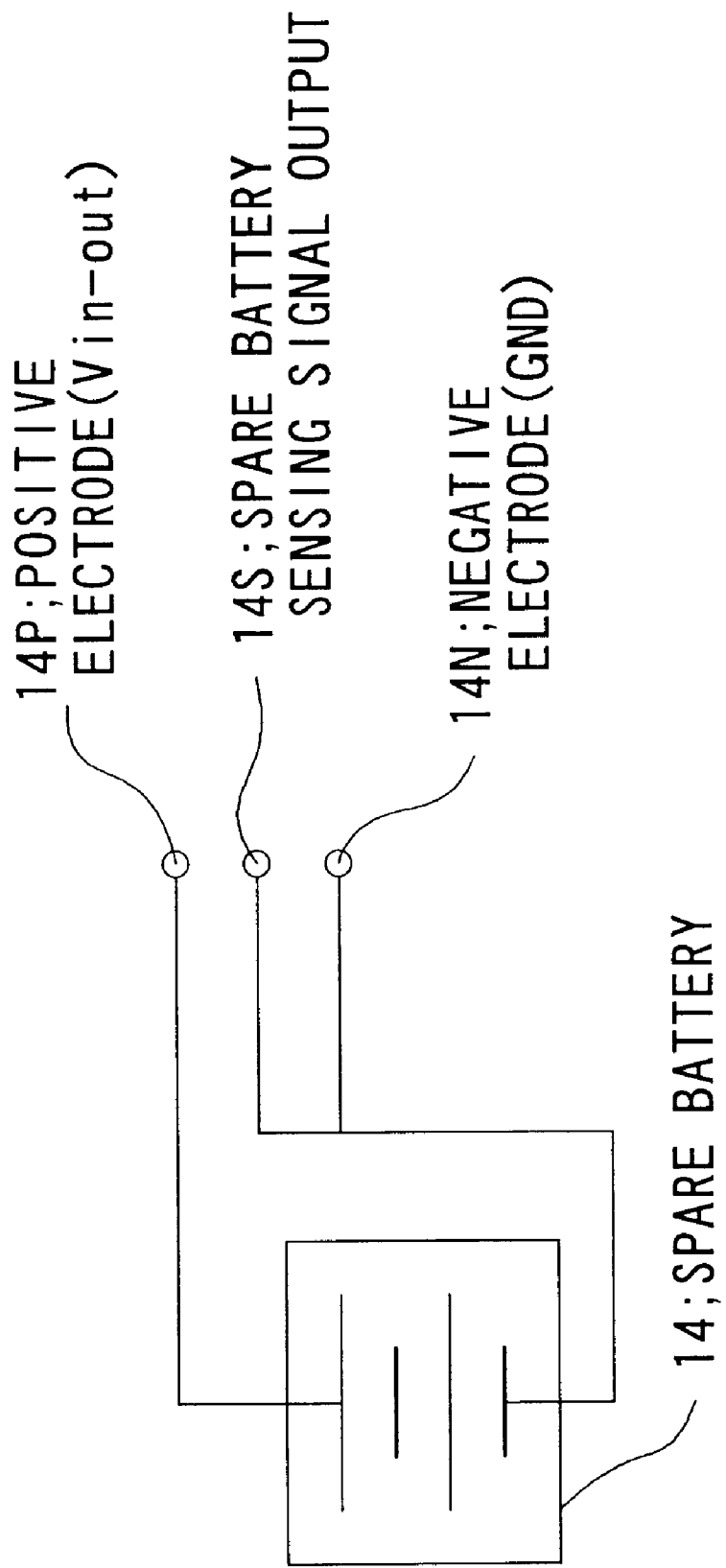
FIG. 2 is a schematic circuit diagram of a circuit for outputting spare battery sensing signals for a spare battery used in the secondary battery life evaluation apparatus.
Figure 3:
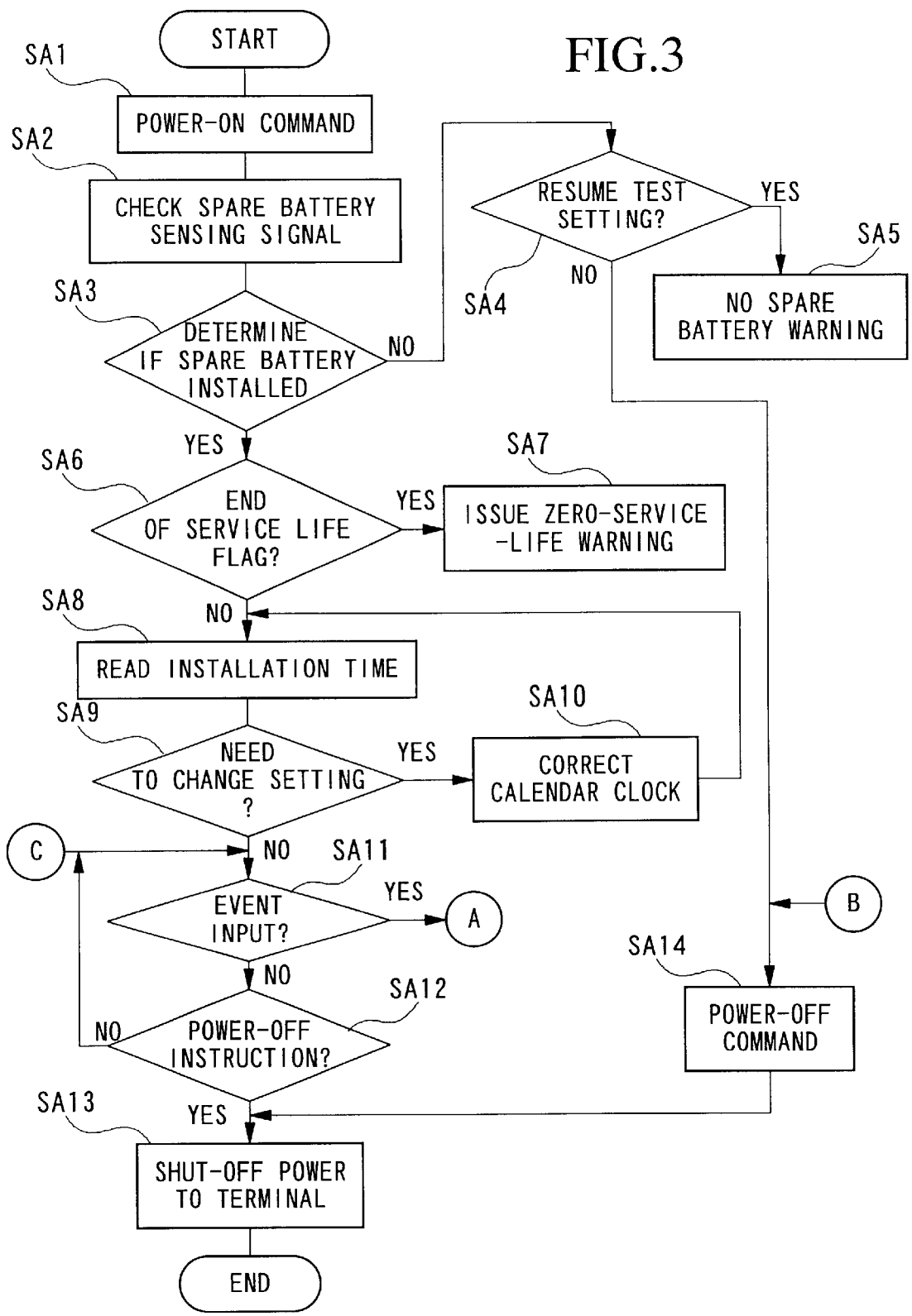
FIG. 3 is a part of the flowchart for a first process of evaluating the secondary battery life used in the secondary battery life evaluation apparatus.
Figures 4, 5:
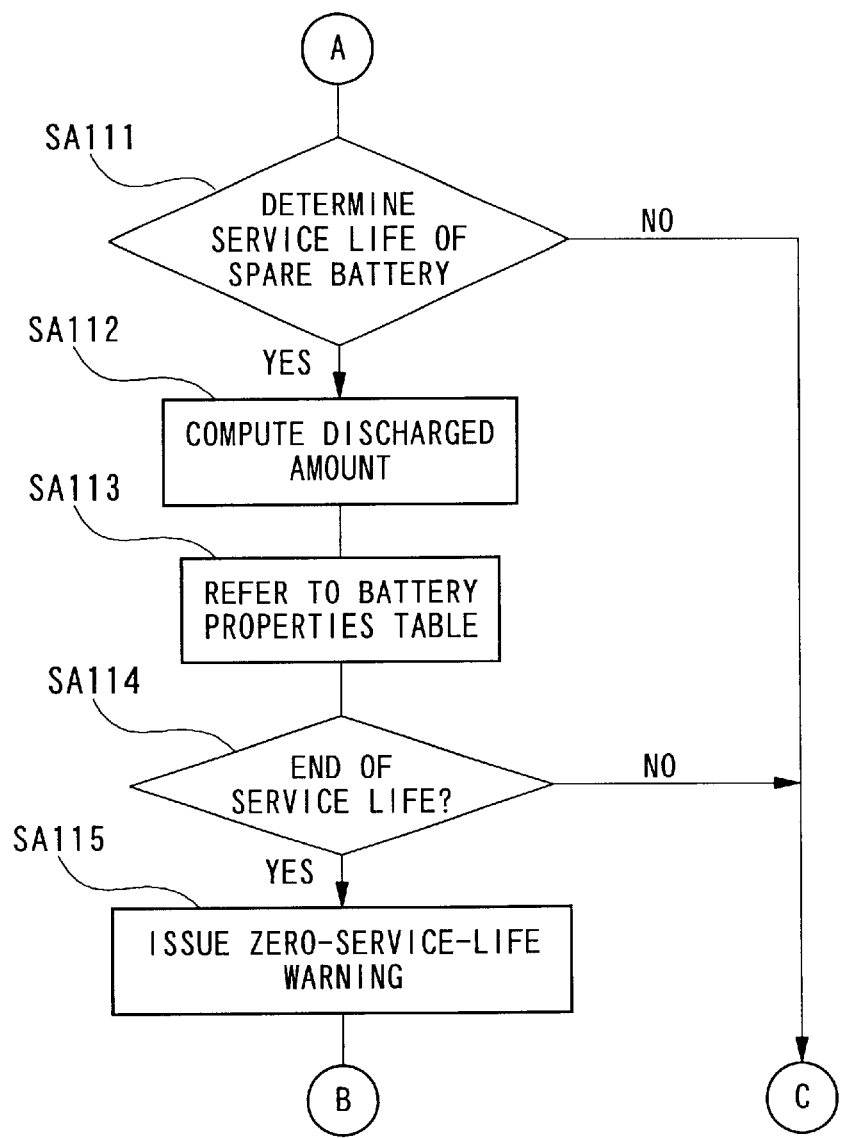
FIG. 4 is the remaining part of the flowchart for the first process of evaluating the secondary battery life used in the secondary battery life evaluation apparatus.
FIG. 5 is a table of secondary battery properties used in the secondary battery life evaluation apparatus.

FIG. 1 is a block diagram of the electrical configuration of the secondary battery life evaluation apparatus in the first embodiment. FIG. 2 is a schematic circuit diagram of a circuit for outputting spare battery sensing signals for a spare battery used in the secondary battery life evaluation apparatus. FIG. 3 is a part of the flowchart for a first process of evaluating the secondary battery life used in the secondary battery life evaluation apparatus. FIG. 4 is the remaining part of the flowchart for the process of evaluating the secondary battery life used in the secondary battery life evaluation apparatus. FIG. 5 is a table of secondary battery properties used in the secondary battery life evaluation apparatus.

The secondary battery life evaluation apparatus in this embodiment evaluates the service life of a secondary battery (spare battery) used in a portable terminal of an information processing device, according to a discharged amount in each discharging event and a pre-determined service life degradation index (an index to show the rate of loss of service life of the spare battery for each discharging event), and the secondary battery life evaluation apparatus 10, shown in FIG. 1, disposed in the portable terminal is comprised by: a main battery 12; spare battery 14; contact terminal 18; charging circuit 20; DC/DC conversion circuit 22; timing circuit 24; control circuit (computer) 26; keyboard 28; RAM 30; ROM 32; FROM 34; liquid crystal display device (LCD) 36; and a touch panel 38 disposed on the surface of the LCD 36. The main battery 12 is constituted by a rechargeable secondary battery, and the spare battery 14 is also the same type of secondary battery for backing up RAM 30. The calendar battery 16 is also a secondary battery.

Here, a pc memory card international association (PCMCIA) controller 42; a plate type flash ROM (compact flash CF) 44; PCMCIA 46; communication circuit 52; optical element 54; and communication connector 56, shown in FIG. 1, are elements belonging to the portable terminal 2 and are not related to the present invention. The PCMCIA controller 42, CF 38 and PCMCIA 40 are used for the execution of application programs stored in CF 38, and are used to trigger various events. The printer control circuit 48 and the printer 50 are used to print data displayed on the LCD 36 or data in memory 30 (billing data). The communication circuit 52 is used to control infrared data input/output at the optical element 54, and to control data input/output performed through the communication connector 56 connected to a personal computer (PC).

The positive and negative electrodes of the main battery 12, spare battery 14 and calendar battery 16 are connected in parallel to the positive and negative electrodes of the DC/DC conversion circuit 22. The DC/DC conversion circuit 22 performs DC/DC conversion of charging circuit 20, main battery 12 and spare battery 14 individually, and these circuits are distinguished from each other by identity signals sent to the timing circuit 24 to show that DC/DC conversion for a particular circuit is being performed. Therefore, the timing circuit 24 keeps a count of each DC/DC conversion event. The positive and negative electrodes of the charging circuit 20 are connected to respective positive and negative electrodes of the contact terminal 18. As shown in FIG. 2, the spare battery 14 is provided with a positive electrode (Vin-out) 14P, a negative electrode (GDN) 14N as well as a spare battery sensing signal output terminal 14S.

Although the DC/DC conversion circuit 22 is shown in FIG. 1 in such a way that it is connected only to the timing circuit 24 and the control circuit 26, it is obvious that this circuit 22 is connected to all those parts in the portable terminal 2 that require a power supply; however, these are not indicated to simplify the diagram.

When the DC/DC conversion circuit 22 is powered externally by connecting an AC adapter (not shown) to the contact terminal 18, it first performs DC/DC conversion of the DC power supplied through the charging circuit 20, and supplies the converted DC power to various parts of the portable terminal 2. When the AC adapter is not connected to the contact terminal 18, the power is supplied internally so that the flows of DC current from the main battery 12, spare battery 14 and the calendar battery 16 are subjected to DC/DC conversion and are supplied to various parts of the portable terminal 2.

The ROM 32 stores programs for carrying out secondary battery life evaluation process shown in FIGS. 3, 4, and the FROM 34 stores a battery properties table shown in FIG. 5. The values of the service life degradation index given in the battery properties table are obtained prior to the use of the terminal by trials using a fully-charged battery. The service life degradation index may be expressed as a "%" or a "fraction".

The control circuit (computer) 26 performs the evaluation steps shown in FIGS. 3, 4 by reading and executing the program given in ROM 32 in the computer.

The keyboard 28 or touch panel 38 and LCD 36 are used to display power-on or power-off, to select resume test and to input request for service life evaluation for example, so as to carry out the steps of secondary battery life evaluation process shown in FIGS. 3, 4.

The operation of the apparatus will be explained with reference to FIGS. 1 to 5.

When beginning the evaluation process for the battery life prior to the current use, (charging/discharging cycle), the keyboard 28 is used to input a power-on command to the evaluation apparatus, which serves as a power-on command to the terminal (FIG. 3, step SA1). Next, secondary battery sensing signals are checked (step SA2). According to the presence of absence of the sensing signals, it is determined whether or not the spare battery is installed (step SA3).

If the spare battery is not installed (no, in step SA3), resume test setting is checked (step SA4). If resume test is indicated (yes, in step SA4), warning is displayed that the spare battery is not installed (step SA5). If the resume test is not given (no, in step SA4), power-off command is given through the keyboard 28 to turn off the power to the supply section of the apparatus except to FROM 34 (step SA14).

If the spare battery is installed (yes, in step SA3), service life flag for the spare battery 14 is checked by referring to parameters in FROM 34 (step SA6). The parameters of service life flag from the previous service life evaluation testing under the control of the control circuit 24 on the spare battery 14 (to be described later) are recorded in FROM 34. If service life flag is active (for example, service life flag bit is "1") (yes, in step SA6), a zero-service-life warning for the spare battery is issued (step SA7).

If the service life flag is not active (for example, when the service life flag bit is "0") (no, in step SA6), the time of installation of the spare battery is obtained (step SA8). The time of installation is obtained from the calendar clock by the control circuit 26 and is recorded in FROM 34. If the time is incorrect, in other words, if the data require correction (yes, in step SA9), the calendar clock is corrected (step SA10), and the correct time is recorded.

If the data do not need correction (no, in step SA9), it is determined if an event has been input (step SA11). There are various kinds of events which are generated by operating the keyboard 28 or touch panel 44. If an event input is no longer required (no, in step SA11), it is determined whether a power-off command has been input from the keyboard 28 to turn off the power to the supply section of the apparatus, except to FROM 34 (step SA12), and if the determination is no (no, in step SA12), it returns to step SA11. If the determination is yes (yes, in step SA12), the power to the portable terminal is turned off (step SA13) so as-to complete processing for the portable terminal.

In contrast, if an event input is detected (yes, in step SA11), upon checking whether or not the event relates to service life evaluation of the spare battery (step SA111), and if the event is not related to service life evaluation of the spare battery (no, in step SA111), it begins the step specified in step SA11.

If the event is related to service life evaluation of the spare battery (yes, in step SA111), a discharged amount is computed (step SA112). The timing circuit 24 counts the elapsed time interval between the spare battery installation time determined in step SA3 and the current time determined in step SA112. The amount of power consumed, i.e., discharged amount is computed according to the time interval and the voltage and current flow readings during this time interval. The computed value of consumed power is recorded in FROM 34. Results of discharged amounts in the previous evaluation tests have been recorded in FROM 34, for each previous life evaluation testing of discharged power.

Using the computed discharged amount and referencing the battery properties table in FROM 34 (refer to FIG. 5), the service life degradation index Lx is obtained to correspond to the discharged amount (step SA113). Then, it is determined whether the value L1 (remaining life) in equation 1 is less than the pre-determined reference value K to evaluate the life expectancy (step SA114).

$$L1 = \{L_1 \times L_2 \times \ldots \times L_n \times\} \times L_{max} \quad (1)$$

where $L_1, L_2, \ldots, L_n$ are various values of the service life degradation index, and $L_{max}$ is the maximum service life of the spare battery expressed in hours, for example.

If the result of evaluation is negative, that is, the value obtained in equation (1) is greater than the reference value K (no, in step SA114), it proceeds to step SA11.

If the result of evaluation is positive, that is, the value obtained in equation (1) is lesser than the reference value K (yes, in step SA114), a zero-service-life warning is issued (step SA115), and it proceeds to step SA14.

Accordingly, the apparatus of this embodiment is designed so that a discharged amount is computed for each input of a power-on command, which starts the terminal to begin consuming power of the spare battery (power discharge), and the time of starting the current discharging process is recorded, and if a service life evaluation event is input during the use of the terminal, a discharged amount during the current discharging is computed based on the start of the current discharging process. A current service life degradation index is computed using the computed discharged amount. The service life of the spare battery is then determined according to the maximum service life of the spare battery, historical values of the service life degradation index and the current value of the service life degradation index to determine whether or not the spare battery is near the end of its service life, and if it determined that the battery is near the end of its service life, a warning is issued. Therefore, the method enables to evaluate the service life of the spare battery and to issue a report on the life expectancy, without adding more resources to the portable terminal, that is without raising the cost of the portable terminal, and enabling to more accurately forecast the remaining life of the spare battery provided for the purpose of backing up the main battery.

Therefore, it is possible to notify that the spare battery needs to be replaced so that the loss of important information contained in the volatile memory in the portable terminal, caused by inattention to the life of spare battery, can be completely prevented, thereby contributing significantly to enabling to maintain smooth operation of the portable information processing device.

Second Embodiment

Figure 6:
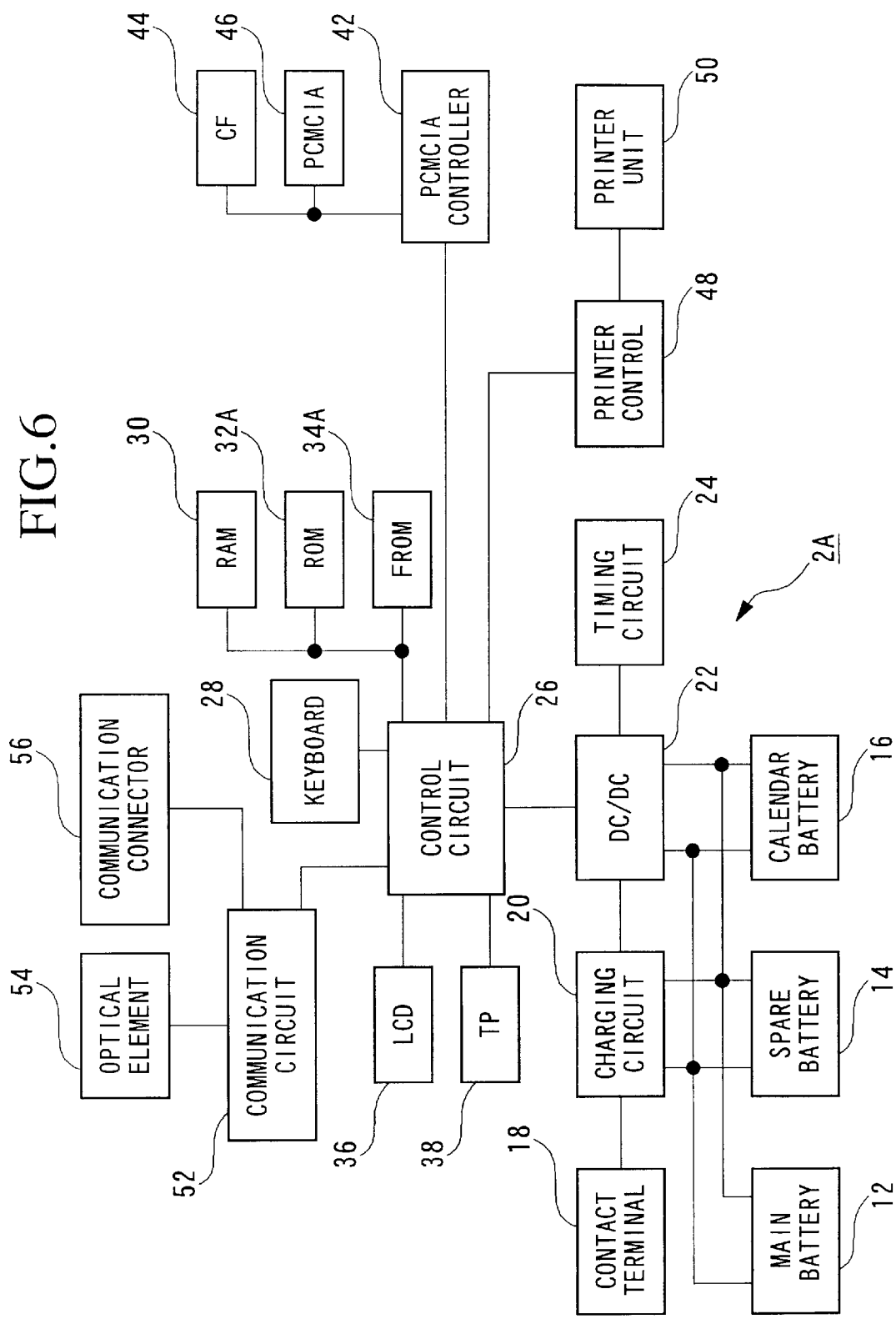
FIG. 6 is a block diagram of the electrical configuration of the secondary battery life evaluation apparatus in a second embodiment of the present invention.
Figure 8:
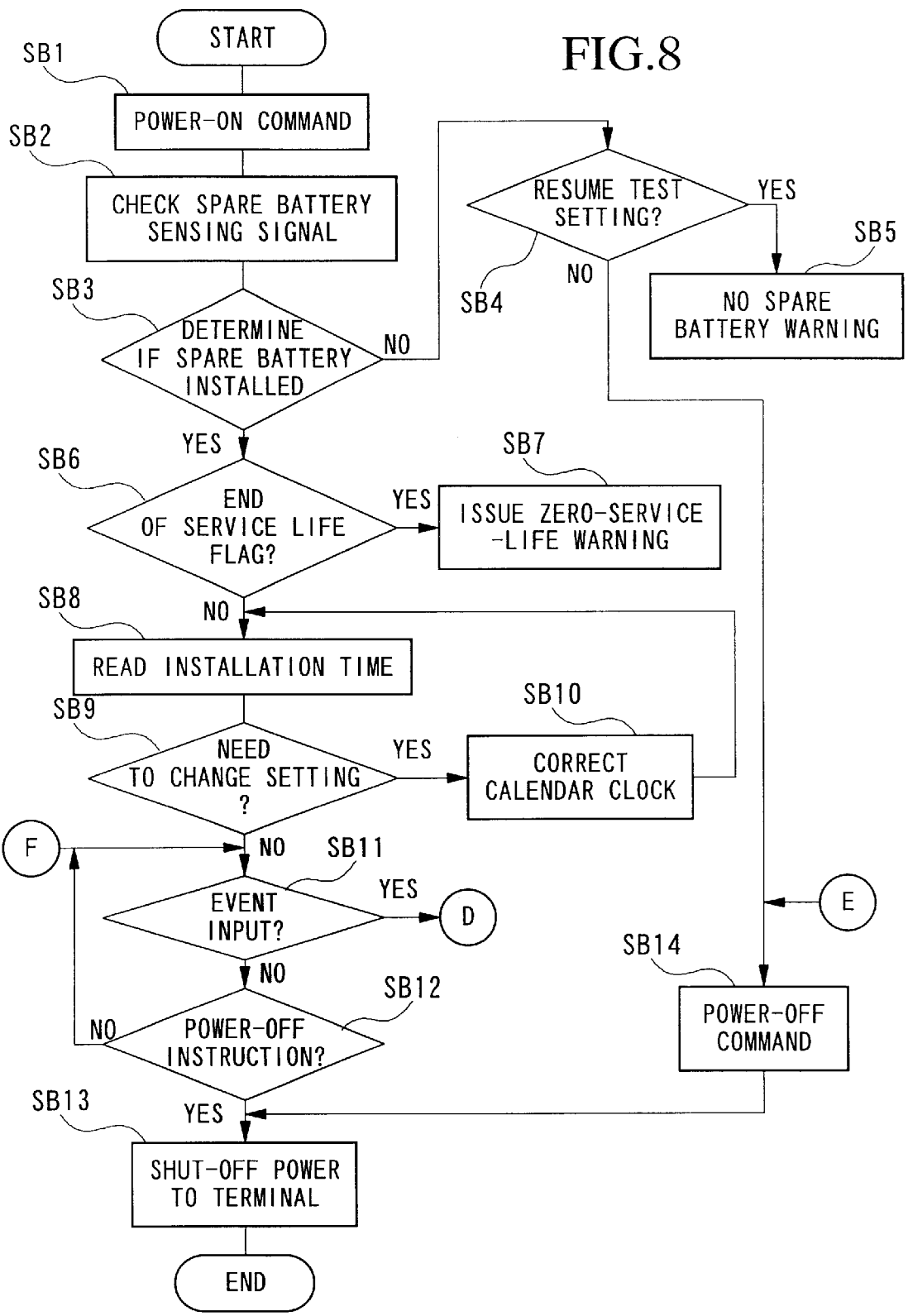
FIG. 8 is a part of the flowchart for a second process of evaluating the secondary battery life used in the secondary battery life evaluation apparatus.
Figure 9:
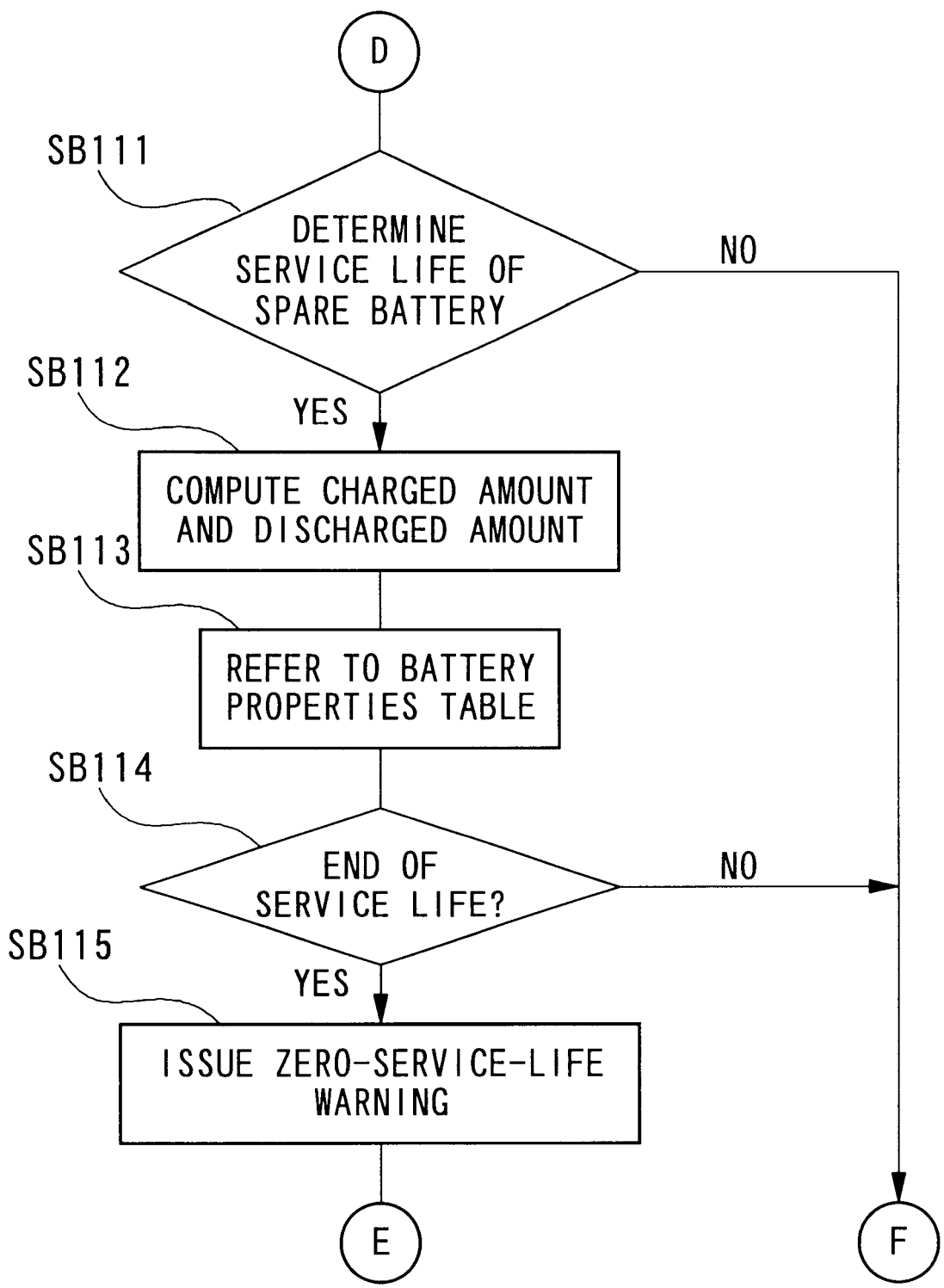
FIG. 9 is the remaining part of the flowchart for the second process of evaluating the secondary battery life used in the secondary battery life evaluation apparatus.

FIG. 6 is a block diagram of the electrical configuration of the secondary battery life evaluation apparatus in a second embodiment of the present invention. FIG. 7 is a table of secondary battery properties used in the secondary battery life evaluation apparatus. FIG. 8 is a part of the flowchart for a second process of evaluating the service life of the secondary battery used in the secondary battery life evaluation apparatus. FIG. 9 is the remaining part of the flowchart for the process of evaluating the service life of the secondary battery used in the secondary battery life evaluation apparatus.

There is a significant difference between the apparatus in this embodiment and the apparatus in the first embodiment that the service life of the battery is evaluated by considering the charged amount and the discharged amount.

That is, as shown in the table of electrical properties shown in FIG. 7, the method is based on obtaining the service life degradation index based on discharged amount and charged amount of the spare battery, so that the step SA112 shown in FIG. 4 is replaced by the step SB112 shown in FIG. 9.

Therefore, the electrical properties table shown in FIG. 7 is stored in FROM 34A, and the program for executing the service life evaluation of spare battery shown by the flowchart shown in FIGS. 8, 9 is stored in ROM 32A shown in FIG. 6. The portable terminal 2A is used for the information processing device.

Excepting the points noted above, the apparatus in the second embodiment is the same as the apparatus in the first embodiment. Those parts of the second embodiment apparatus that are the same as those in the first embodiment are given the same reference numerals, and their explanations are omitted.

Next, the operation of the apparatus will be explained with reference to FIGS. 6 to 9.

In this embodiment, the steps in the process of evaluating the service life of a spare battery from the step of inputting a power-on command (power to the apparatus) using the keyboard 28 to the step of judging whether or not an event input has taken place (step SB1 in FIG. 8) is the same as the steps described in the first embodiment. In other words, processing steps from SB11 to SB11 are the same as the steps SA1 to SA11 shown in FIG. 3.

If the test setting does not require any change (no, in step SB9), it judges whether or not an event has been input (SB11). There are various kinds of events which are generated by operating the keyboard 28 or touch panel 38. If an event input is no longer required (no, in step SB11), it is determined whether a power-off command has been input from the keyboard 28 to turn off the power supply section of the apparatus, except to the FROM 34 (step SB12), and if the determination is no (no, in step SB12), it returns to step SB11. If the determination is yes (yes, in step SB12), the power to the portable terminal is turned off (step SB13) so as to complete processing for the portable terminal.

In contrast, if an event input is detected (yes, in step SB11), and upon checking whether or not the event relates to service life evaluation of the spare battery (step SB11), and if the event is not related to service life evaluation of the spare battery (no, in step SB111), it begins the step specified by step SB11.

If the event is related to service life evaluation of the spare battery (yes, in step SB111), charge/discharge cycle history is confirmed, i.e., charged amount and discharged amount are computed (step SB112). After the power is turned off subsequent to the last use of the portable terminal, the timing circuit 24 counts the charging time interval between the charging start time of the spare battery to the charging stop time engaged by the charging circuit 20. The amount of power charged is computed according to the charging time interval and the voltage and current flow readings during the charging time interval. Also, the elapsed time interval between the battery installation time (which was determined in step SB113) to step SB112 is obtained by the count made according to the timing circuit 24. Based on the elapsed time interval, voltage and current flow during the elapsed time interval, the discharged amount is computed. The values of computed charged amount and discharged amount of the spare-battery are recorded in FROM 34. Previous results of discharged/discharged amounts accrued prior to the current charged/discharged amounts have been recorded in FROM 34, for each previous computation of discharged/charged amounts.

Using the computed discharged/charged amounts and referencing the battery properties table in FROM 34 (refer to FIG. 7), the service life degradation index Lx is obtained to correspond to the discharged amount (step SB113). Then, it is determined whether the value L2 (remaining life) in equation 1 is less than the pre-determined reference value K to evaluate the life expectancy (step SB114).

$$L2 = \{L_{11} \times L_{12} \times \ldots \times Lnn\} \times L_{max} \quad (2)$$

where $L_{11}, L_{12}, \ldots, L_{nn}$ are various values of the service life degradation index, and $L_{max}$ is the maximum service life of the spare battery expressed in hours, for example.

If the result of evaluation is negative, that is, the value obtained in equation (2) is greater than the reference value K (no, in step SB114), it proceeds to step SB11.

If the result of evaluation is positive, that is, the value obtained in equation (2) is lesser than the reference value K (yes, in step SB114), a warning is issued (step SB115), and it proceeds to step SA14.

Accordingly, prior to the use of the portable terminal, the apparatus of this embodiment uses the timing circuit 24 to compute the time interval between the charge-start time and the charge-stop time of the charging process performed by the charging circuit 20, so that a charged amount can be computed according to the clocked time interval, voltage and current flow in the spare battery. When a power-on command is input to begin consuming power of the spare battery (power discharge) and start the discharging process, the discharge-start time is recorded, and if a service life evaluation event is input during the use of the terminal, the amount discharged is computed starting from the recorded discharge-start time. Based on the computed charged/discharged amounts, a current service life degradation index is computed, according to the maximum service life of the spare battery, historical values of the service life degradation index obtained prior to the current charge/discharge event, and a value of the current service life degradation index. It is then determined whether or not the service life of the spare battery is near the end point by comparing the current value of the index with the reference value and if it is indicated that the battery is near the end of its service life, a warning is issued. Therefore, the method enables to evaluate the service life of the spare battery and to issue a report on the life expectancy, without adding more resources to the portable terminal, that is without raising the cost of the portable terminal, thereby enabling to more accurately forecast the remaining service life of the spare battery provided for the purpose of backup battery to the main battery.

Therefore, it is possible to notify that the spare battery needs to be replaced so that the loss of important information contained in volatile memory in the portable terminal, caused by inattention to the life of spare battery, can be completely prevented, thereby contributing significantly to enabling to maintain smooth operation of the portable information processing device.

Third Embodiment

Figure 10:
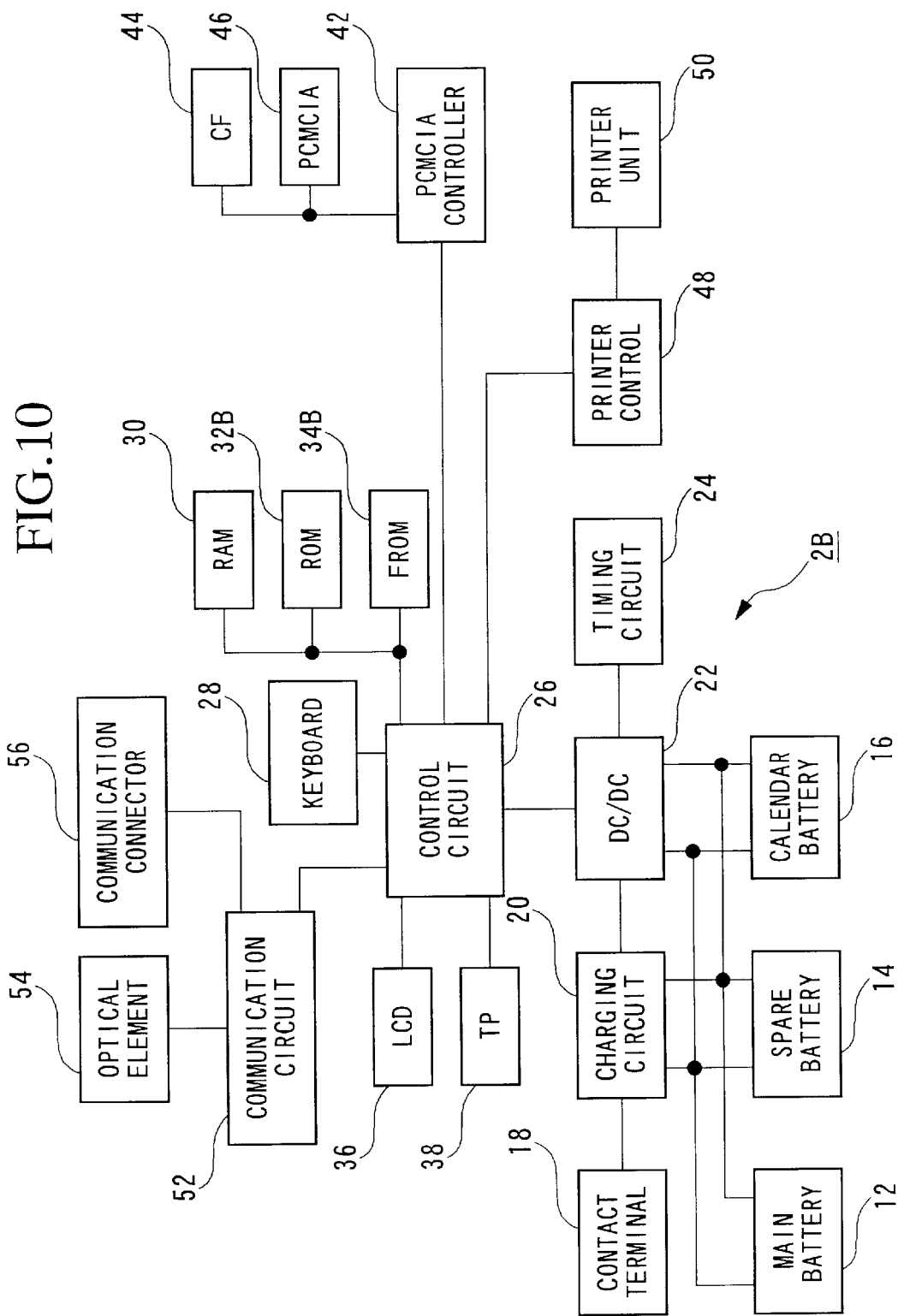
FIG. 10 is a block diagram of the electrical configuration of the secondary battery life evaluation apparatus in a third embodiment of the present invention.
Figure 12:
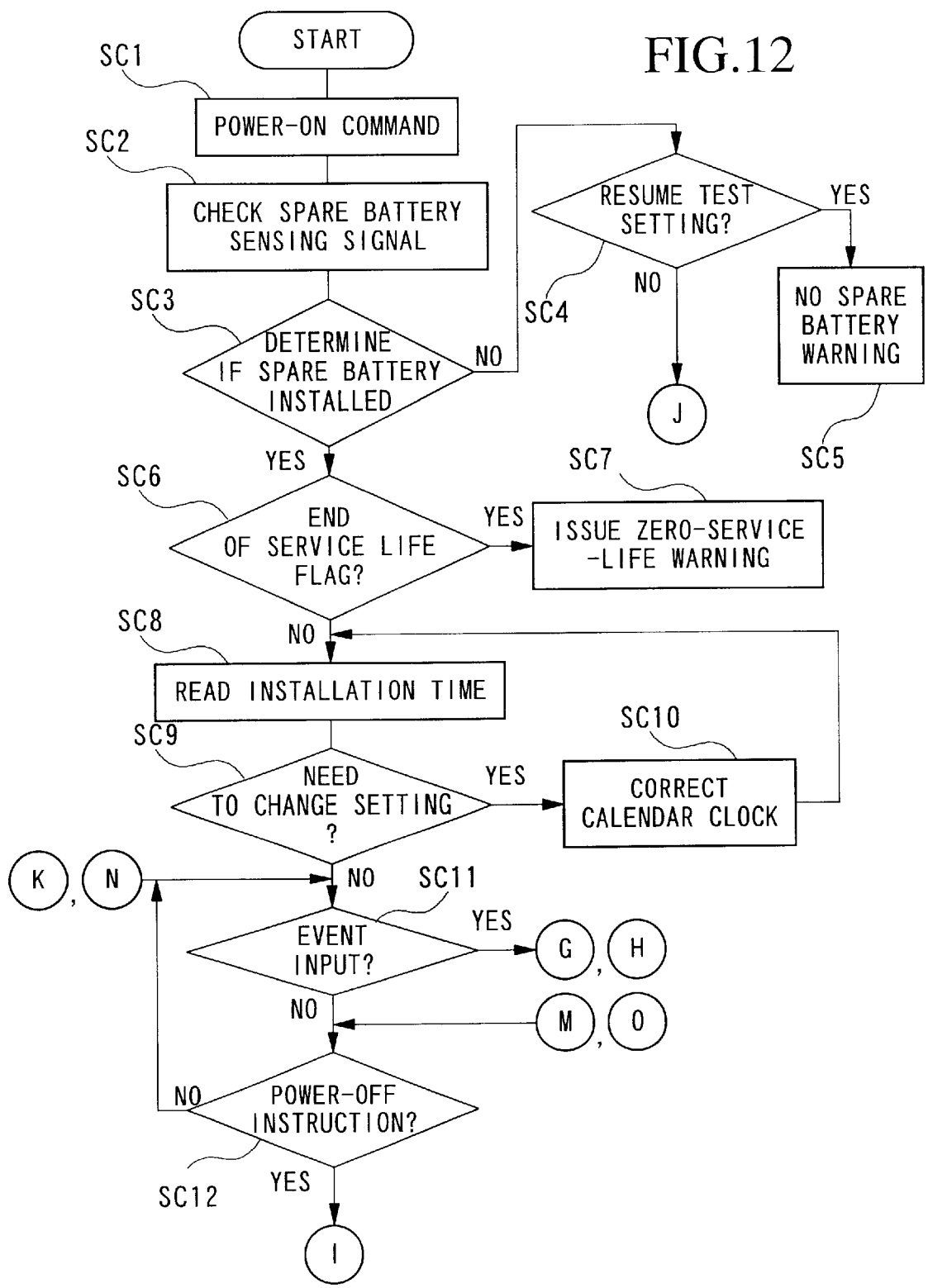
FIG. 12 is a part of the flowchart for a third process of evaluating the secondary battery life used in the secondary battery life evaluation apparatus.
Figure 13:
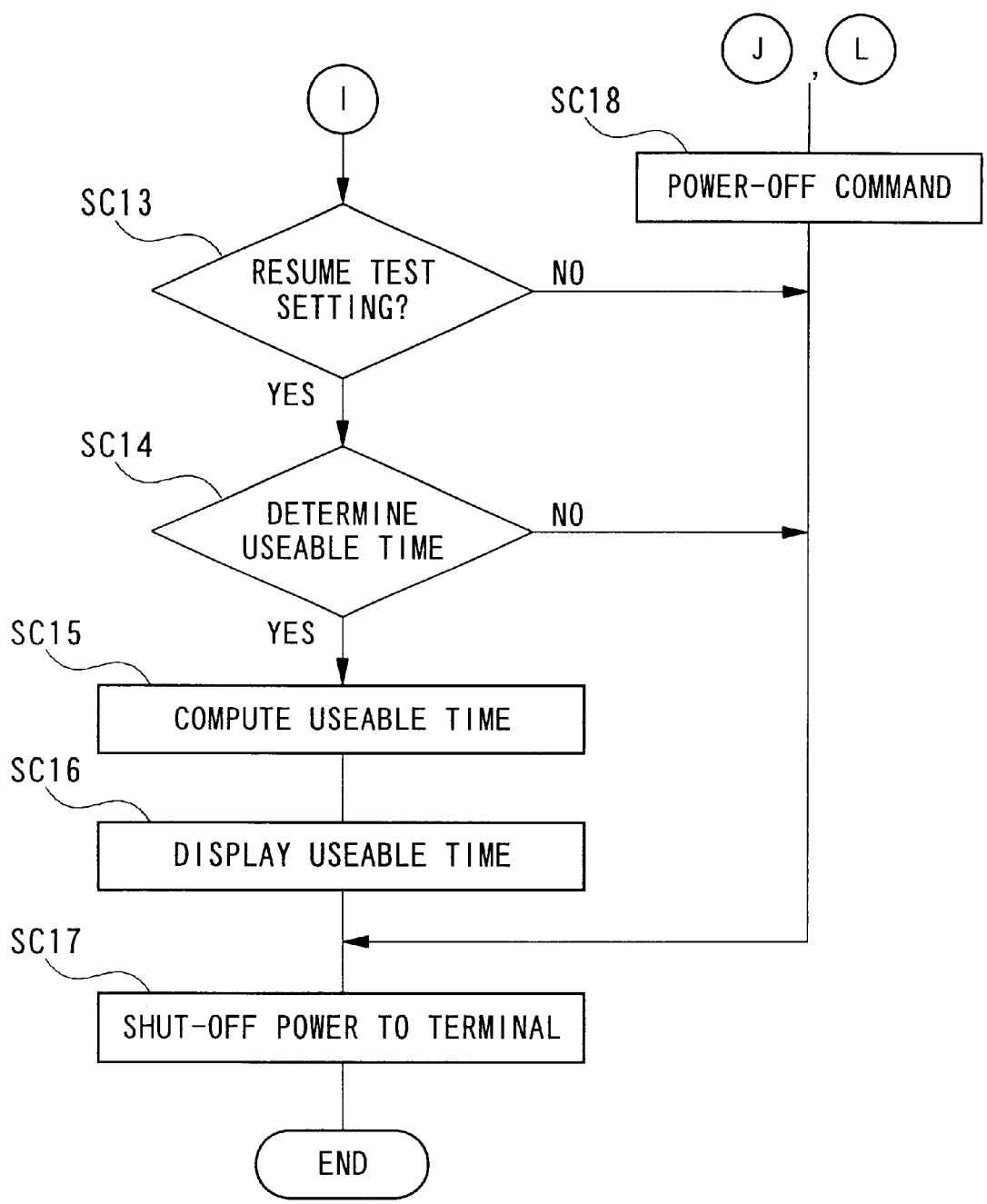
FIG. 13 is another part of the flowchart for the third process of evaluating the secondary battery life used in the secondary battery life evaluation apparatus.
Figure 14:
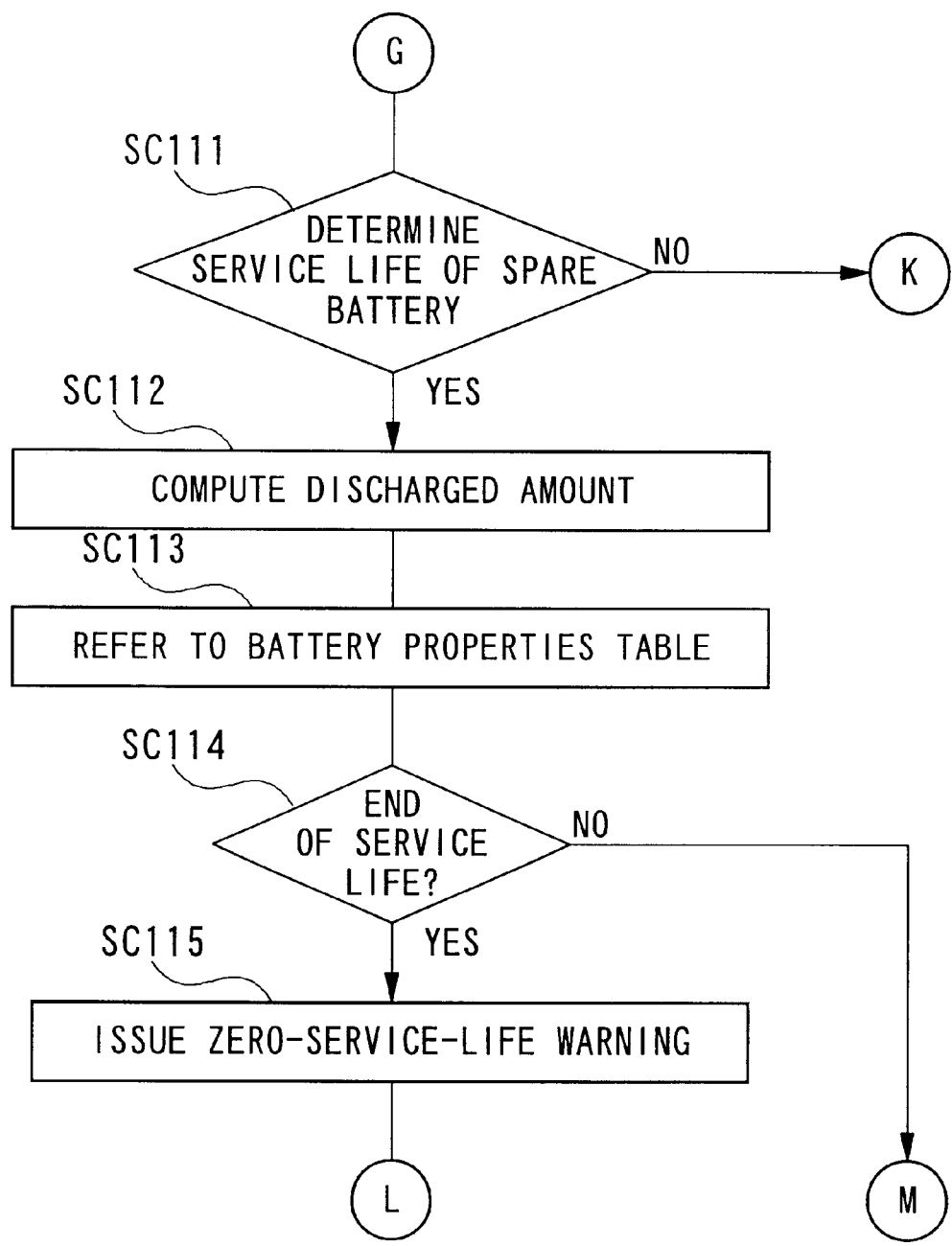
FIG. 14 is still another part of the flowchart for the third process of evaluating the secondary battery life used in the secondary battery life evaluation apparatus.
Figure 15:
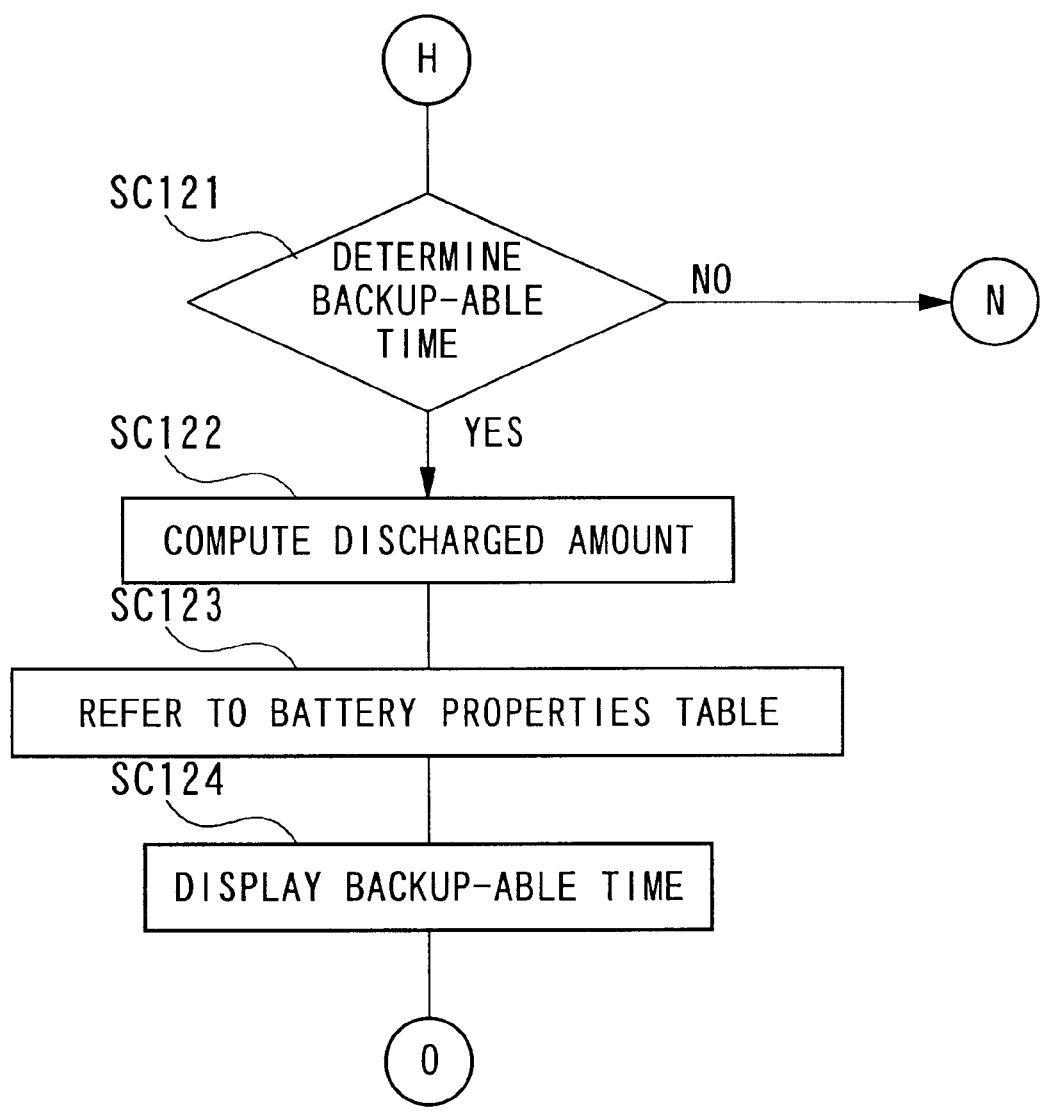
FIG. 15 is the remaining part of the flowchart for the third process of evaluating the secondary battery life used in the secondary battery life evaluation apparatus.

FIG. 10 is a block diagram of the electrical configuration of the secondary battery life evaluation apparatus in a third embodiment of the present invention. FIG. 11 is a secondary battery properties table used in the secondary battery life evaluation apparatus. FIG. 12 is a part of the flowchart for a third process of evaluating the service life of the secondary battery used in the secondary battery life evaluation apparatus. FIG. 13 is another part of the flowchart for the process of evaluating the service life of the secondary battery used in the secondary battery life evaluation apparatus. FIG. 14 is still another part of the flowchart for the process of evaluating the service life of the secondary battery used in the secondary battery life evaluation apparatus. FIG. 15 is the remaining part of the flowchart for the process of evaluating the service life of the secondary battery used in the secondary battery life evaluation apparatus.

There are two significant differences between the first embodiment and the third embodiment. First difference is that, when an event is input to confirm the backup-able life of the secondary battery, a report on how long the battery is able to provide backup service is provided on the basis of the discharged amount, and the second difference is that in addition to reporting the service life and backup-able life of the secondary battery, if resume test setting is given, the useable time is reported on the basis of the conditions of usage of the secondary battery.

That is, the battery properties table is prepared so that the backup-able life can be obtained by knowing the discharged amount, as shown in FIG. 11, and when an inquiry event for backup-able life is input during the use of the terminal (power-on and power-off of the portable terminal), the backup-able life is reported on the basis of the discharged amount in the current use of the secondary battery. Also, the backup-able life is computed according to detailed historical data as follows. First, for each event of service life evaluation, the amount of consumed service life during the service life evaluation testing and the duration required to perform service life testing are stored, and an average life consumed and average duration required per one evaluation are computed based on the cumulative life consumed and test durations. Second, an expected useable time is reported based on the maximum service life of the secondary battery, consumed service life in each evaluation, average life consumed and average time used to perform the evaluation. Therefore, the battery properties table shown in FIG. 11 is stored in FROM 34B shown in FIG. 10, and the program for executing the process of secondary battery life evaluation shown in the flowchart shown in FIGS. 12~15 is stored in ROM 32B. In this embodiment, the portable terminal is referenced as 2B.

Other aspects of the structure are the same as those in the first embodiment, so that the same components are given the same reference numerals in FIG. 10, and their explanations are omitted.

Next, the operation of the third embodiment will be explained with reference to FIGS. 10~15.

In this embodiment, individual steps between the power-on event through the keyboard 28 (step SC1 in FIG. 12) to input of an event (step SC11) are the same as those in the first embodiment, and therefore, explanations of individual steps SC1~SC11 (corresponding to steps SA1~SA11 in FIG. 4) are omitted.

When an event is input (yes, in step SC11), and if the event relates to secondary battery service life determination (step SC111 in FIG. 14), the processing steps are the same as those in the first embodiment (steps SC112~SC115). In the battery life evaluation in step SC114, if it is determined that the service life has ended (yes, in step SC114), it is so indicated on the LCD 36 (step SC115), and the power (except to the FROM 34) is turned off according to power-off instruction (step SC18), and the power is turned off at the portable terminal (step SC17).

If, in the life evaluation in step SC114, it is determined that there is service life remaining (no, in step SC114), it is checked whether the power-off instruction is given (step SC12). If there is no such instruction (yes, in step SC12), it is checked whether the resume test setting is given (step SC13). If there in no resume test setting (no, in step SC13), the power to the portable terminal is turned off (step SC17) to finish the process.

If there is resume test setting (yes, in step SC13), it is determined whether there is usable time determination of the secondary battery required (step SC14). If there is no determination of useable time required (no, in step SC14), the power to the portable terminal is turned off to finish the process.

If there is useable time determination (yes, in step SC14), useable time is computed (step SC15). Useable time S is computed according to equation (3).

$$S = \{(L_{max} - X)/Y\} \times Z \qquad (3)$$

where $L_{max}$ relates to the maximum service life of spare battery given in hours, for example, X relates to a sum of the consumed service life in each of the past uses including the current use $(X_1 + X_2 + \ldots + X_n$, where $X_1$ is a the consumed service life in the first use, $X_2$ is a the consumed service life in the second use and $X_1$ is a the consumed service life in the n-th use), and Y relates to an average amount of decrease $X/n$, and Z relates to an average use time including the current use of the portable terminal. The amount of consumed service life is a difference between the service life remaining at the previous use and the service life remaining at the current use. The service life remaining is obtained from equation (1). Average use time is obtained by obtaining a sum of the individual time intervals between the power-on event (step SC1) to power-off event (step SC17) for each use of the terminal, by using the timing circuit 24, and dividing the sum by the number of times of use of the portable terminal.

The computed useable time is displayed on LCD 36 (step SC16), and the power to the portable terminal is turned off (step SC17) to finish the process.

If an event is input (yes, in step SC11), and if the event is a determination of the backup-able time for the spare battery (yes, in step SC121 in FIG. 15), the amount discharged in the current use is computed (step SC122) as in the first embodiment. Using the computed discharged amount, backup-able time is obtained from the battery properties table (refer to FIG. 11) with reference to FROM 34B (step SC123). The backup-able time is displayed on LCD 36 (step SC124).

Following the display of backup-able time, as in the case of determination of the service life of the spare battery, it is checked whether power-off command is given (step SC12). If there is no power-off command (no, in step SC12), it begins processing in step SC11. If there is a power-off command (yes, in step SC12), it is determined whether there is resume test setting (step SC13).

Depending on whether there is resume test setting, useable time is displayed (step SC16) and the power to the terminal is turned off to finish the process.

According to this embodiment, the amount of consumed service life and the use time are stored for each use of the portable terminal, and the average use time for one use is computed from the stored values of the consumed service life, and an average use time for one use is computed from the stored use times. Then, using the stored values of the consumed service life, computed values of the average consumed service life and average use time and the maximum life of the spare battery, useable time to the end of the service life of the spare battery (life expectancy) is displayed so that the user of the portable terminal can determine the useable service life still remaining in the spare battery.

Also, the amount of power discharged for each use of the terminal can be computed so that the backup-able time remaining after the current use can be forecast by referencing the battery properties table in accordance with the computed discharged amount.

Therefore, it is possible to forecast the useable remaining power after the current use of the terminal and to notify the user that the spare battery needs to be replaced so that the loss of important information contained in the volatile memory in the portable terminal, caused by inattention to the life of spare battery, can be completely prevented, thereby contributing significantly to enabling to maintain smooth operation of the portable information processing device.

Fourth Embodiment

Figure 16:
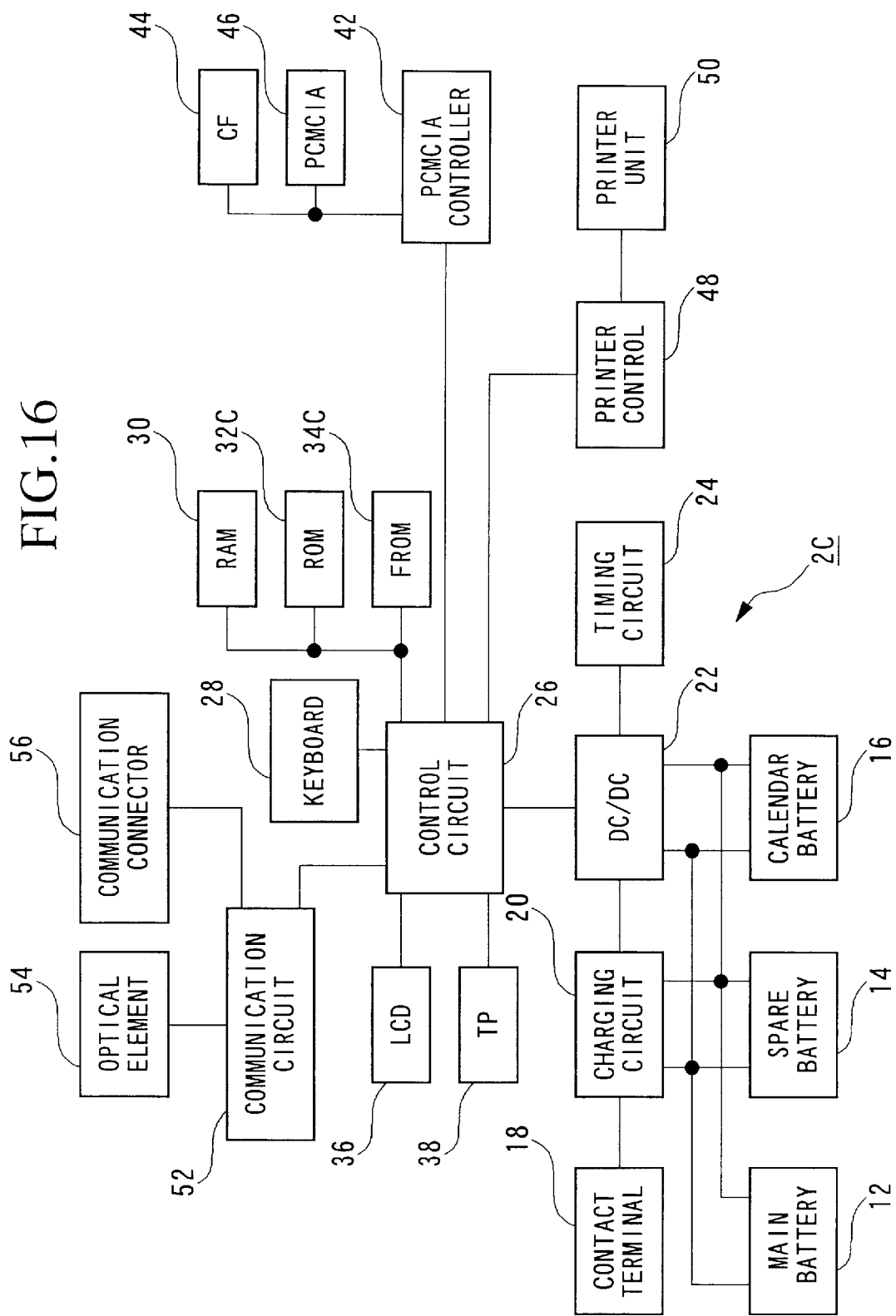
FIG. 16 is a block diagram of the electrical configuration of the secondary battery life evaluation apparatus in a fourth embodiment of the present invention.
Figure 18:
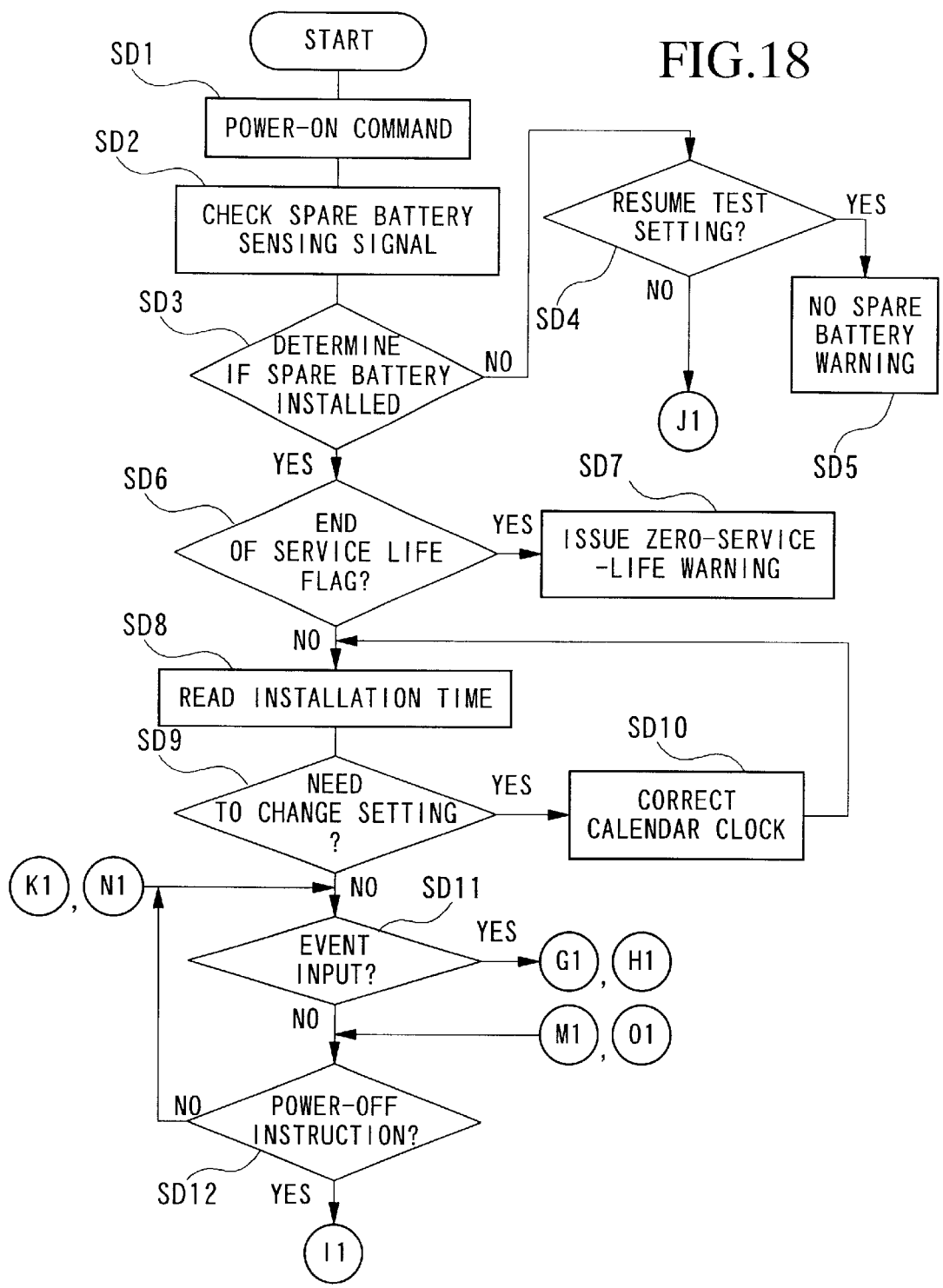
FIG. 18 is a part of the flowchart for a fourth process of evaluating the secondary battery service life used in the secondary battery life evaluation apparatus.
Figure 19:
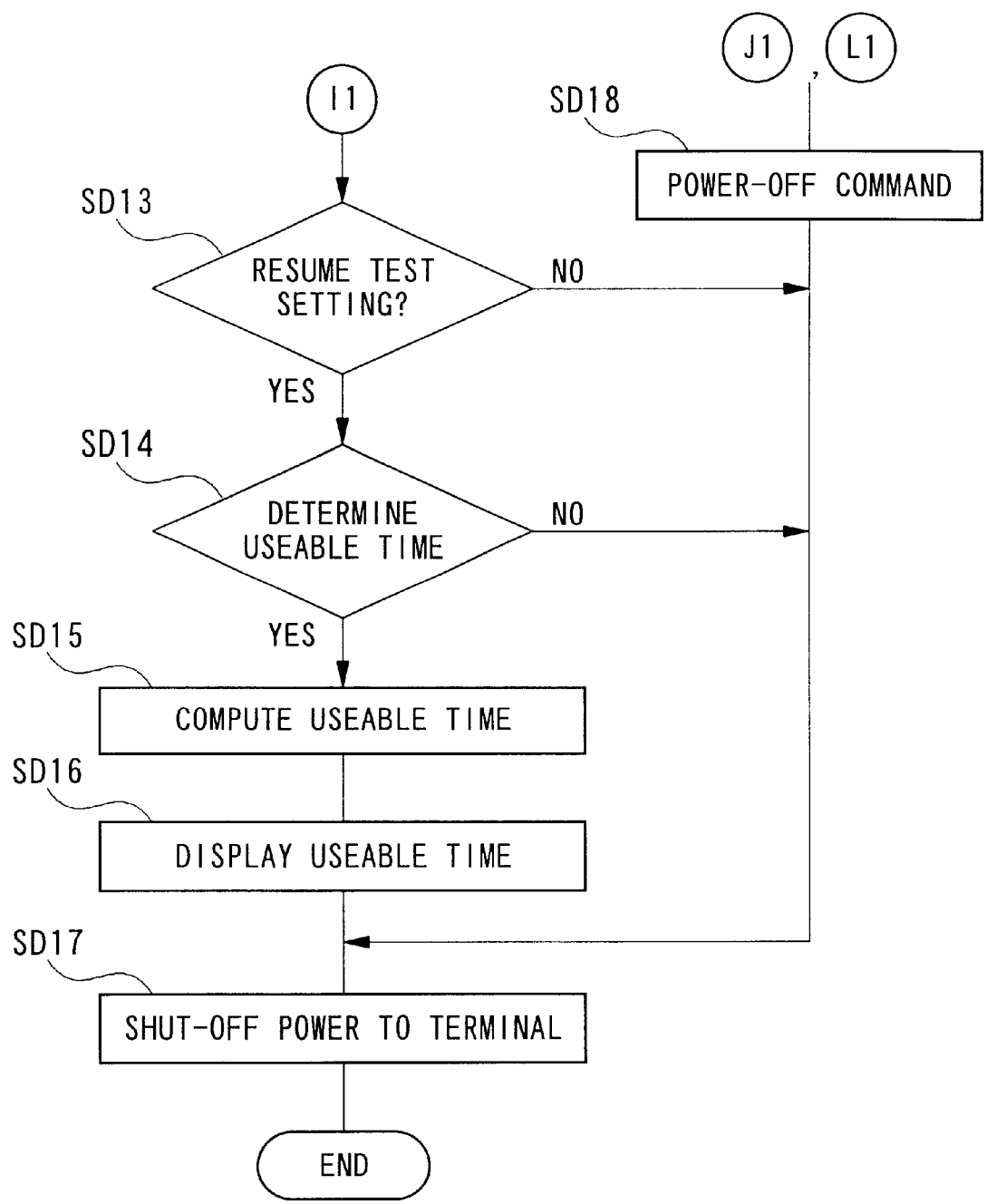
FIG. 19 is another part of the flowchart for the fourth process of evaluating the secondary battery life used in the secondary battery life evaluation apparatus.
Figure 20:
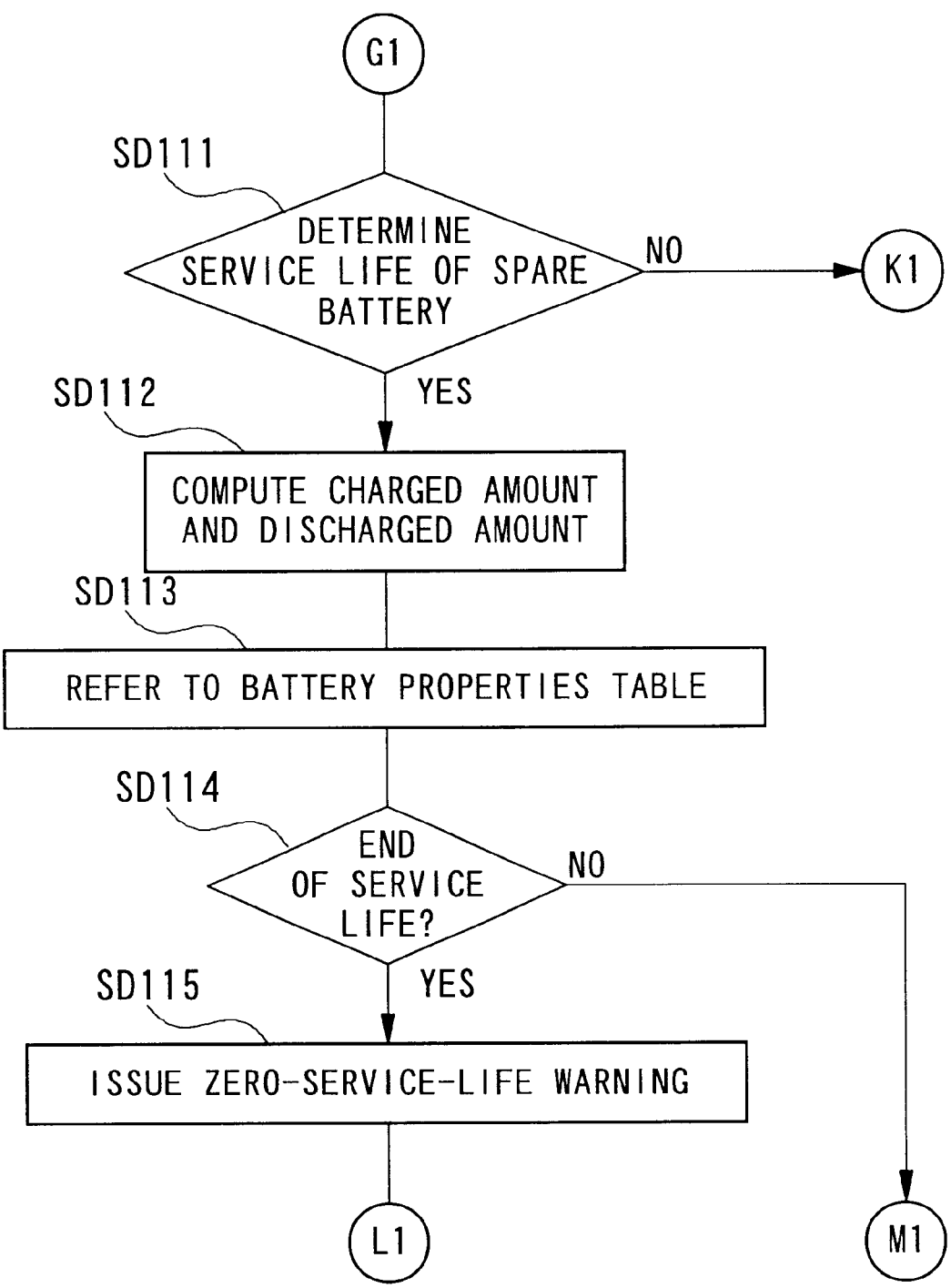
FIG. 20 is still another part of the flowchart for the fourth process of evaluating the secondary battery life used in the secondary battery life evaluation apparatus.
Figure 21:
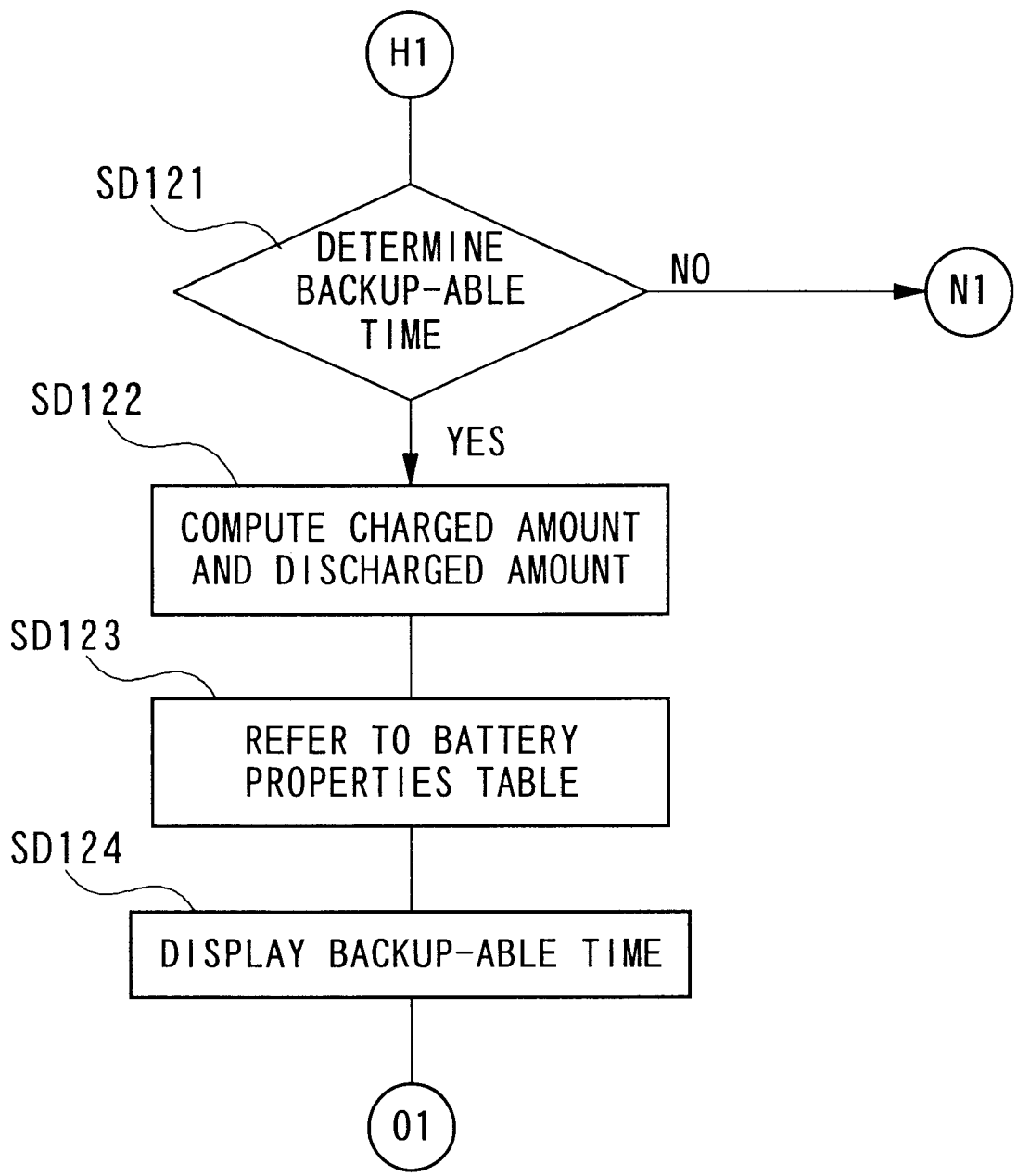
FIG. 21 is the remaining part of the flowchart for the fourth process of evaluating the secondary battery life used in the secondary battery life evaluation apparatus.

FIG. 16 is a block diagram of the electrical configuration of the secondary battery life evaluation apparatus in the fourth embodiment of the present invention. FIG. 17 is a table of secondary battery properties used in the secondary battery life evaluation apparatus. FIG. 18 is a part of the flowchart for a fourth process of evaluating the secondary battery service life used in the secondary battery life evaluation apparatus. FIG. 19 is another part of the flowchart for the process of evaluating the secondary battery life used in the secondary battery life evaluation apparatus. FIG. 20 is still another part of the flowchart for the process of evaluating the secondary battery life used in the secondary battery life evaluation apparatus. FIG. 21 is the remaining of the flowchart for the process of evaluating the secondary battery life used in the secondary battery life evaluation apparatus.

There are two significant differences between this embodiment and the first embodiment. First difference is that the backup-able time of a spare battery is reported at the time of inputting the backup-able time determination on the basis of discharged amount and charged amount. Second difference is that, in addition to reporting the service life and backup-able time of the spare battery, if there is resume test setting, the useable time is reported on the basis of the historical values of usage of the spare battery.

That is, as shown in the battery properties table in FIG. 17, backup-able times are related to discharged amount and charged amount. If there is an event input for determination of the amount of power charged between the charge-start time prior to the current use of the terminal to the charge-stop time of the charging circuit, and the backup-able time between the power-on and power-off events of the terminal, the backup-able time is reported on the basis the amount of discharge during the current usage of the spare battery to report the backup-able time. Also, for each use of the portable terminal, consumed service life for performing service life evaluation testing and the length of time required in carrying out service life testing only are stored for each evaluation testing, and the average use time for one use is computed from the stored values of consumed service life, and an average use time for one use is computed from the stored use times required in individual tests. Then, a useable time to the end of the service life of the spare battery is reported according to the maximum life of the spare battery, the values of the consumed service life, average consumed service life and average use time.

Therefore, the battery properties table shown in FIG. 17 is stored in FROM 34C shown in FIG. 16, and the program for executing the process of secondary battery life evaluation shown in the flowchart shown in FIGS. 18~21 is stored in ROM 32C. In this embodiment, the portable terminal is referenced as 2C.

Excepting the points noted above, the apparatus in the this embodiment is the same as the apparatus in the first embodiment. In FIG. 16, the parts that are the same as those in FIG. 1 are given the same reference numerals, and their explanations are omitted.

Next, the operation of the apparatus in the fourth embodiment will be explained with reference to FIGS. 16~21.

In this embodiment, individual steps between the power-on event through the keyboard 28 (step SD1 in FIG. 18) to input of an event (step SD11) are the same as those in the first embodiment, and therefore, explanations of individual steps SD1~SD11 (corresponding to steps SA1~SA11 in FIG. 4) are omitted.

When an event is input (yes, in step SD11), and if the event relates to secondary battery service life evaluation (step SD111 in FIG. 20), the processing steps are the same as those in the first embodiment (steps SD112~SD115). In the battery life evaluation in step SD114, if it is determined that the service life has been exhausted (yes, in step SD114), it is indicated on the LCD 42 that the service life is ended (step SD115), and when instructed to turn off the power at the portable terminal (step SD17), the power (to the supply section of the apparatus except to FROM 34) is turned off to the portable terminal.

In the service life evaluation step in step SD114, if it is determined that there is service life remaining (no, in step SD114), it is checked whether the power-off instruction is given (step SD12). If there is no such instruction (no, in step SD12), step SD11 is processed. If there is such a command (yes, in step SD12), it is determined whether the resume test setting is given (step SD13). If there in no resume test setting (no, in step SD13), the power to the portable terminal is turned off (step SD17) to finish the process.

If there is resume test setting (yes, in step SD13), it is determined whether there is usable time determination of the secondary battery according to historical data (step SD14). If there is no determination of useable time required (no, in step SD14), the power to the portable terminal is turned off to finish the process.

If there is useable time determination required (yes, in step SD14), useable time is computed (step SD15). Useable time S is computed according to equation (4).

$$S=\{(L_{max}-X)/Y\} \times Z \qquad (4)$$

where $L_{max}$ relates to the maximum service life of spare battery given in hours, for example, X relates to a sum of the values of the consumed service life in each of the past uses including the current use $(X_1+X_2+ \ldots +X_n)$, where $X_1$ is a consumed service life in the first use, $X_2$ is a consumed service life in the second use and $X_1$ is a consumed service life in the n-th use), and Y relates to an average amount of decrease X/n, and Z relates to an average use time including the current use time of the portable terminal. The amount of consumed service life is a difference between the service life remaining at the previous use and the service life remaining at the current use. The remaining service life is obtained from equation (2). The average use time is computed by obtaining a sum of the individual use times between the power-on (step SD1) to power-off (step SD17), for each use of the terminal, using the timing circuit 24, and dividing the sum by the number of use times of the portable terminal.

The computed useable time is displayed on LCD 42 (step SC16), and the power to the portable terminal is turned off (step SC17) to finish the process.

If an event is input (yes, in step SD11), and if the event is a determination of the backup-able time for the spare battery (yes, in step SC121 in FIG. 21), the amount of charge in the previous use and the amount discharged in the current use are computed (step SD122). Using the computed and stored charged amount prior to the current use, and the amount discharged in the current use, the backup-able time is obtained from the battery properties table (refer to FIG. 11) with reference to FROM 34B (step SD123). Computation of the charged amount is carried out by clocking the charging-start time and charging-stop time by the timing circuit 24 in conjunction with the voltage of the spare battery and current flow, and the computed charged amount is stored in FROM 34. The backup-able time thus obtained is displayed on LCD 36 (step SC124).

Following the display of backup-able time, it is determined whether a power-off command is given (step SD12). If there is no power-off command (no, in step SD12), it begins processing in step SD11. If there is a power-off command (yes, in step SD12), it is determined whether there is resume test setting (step SC13).

Depending on whether there is resume test setting, useable time is displayed (step SD16) and the power to the terminal is turned off to finish the process.

According to this embodiment, for each use of the portable terminal, the amount of consumed service life and the use time are stored in memory, and an average consumed service life for one use is computed from the stored values of consumed service life, and an average use time for one use is computed from the stored use times. Then, using the stored values of consumed service life, computed average consumed service life, average use time and the maximum life of the spare battery, useable time to the end of the service life of the spare battery (life expectancy) is displayed so that the user of the portable terminal can determine the useable service life now remaining in the spare battery.

Also, the amounts of power charged and discharged for each use of the terminal can be computed so that the backup-able time remaining after the current use can be forecast by referencing the battery properties table in accordance with the computed values of the charged and discharged amounts.

Therefore, it is possible to forecast the useable remaining power after the current use of the terminal and to notify the user that the spare battery needs to be replaced so that the loss of important information contained in the volatile memory in the portable terminal, caused by inattention to the life of spare battery, can be completely prevented, thereby contributing significantly to enabling to maintain smooth operation of the portable information processing device.

Accordingly, the present invention has been presented with reference to the specific examples in the diagrams, however, applicable configurations of the invention are not limited to those illustrated in the diagrams and includes those modifications of the basic design that can be derived from the design principle demonstrated.

For example, in the second and fourth embodiments, although the useable time was computed using the maximum life of the spare battery, a sum of the consumed service life to the time of computation, average consumed service life and average use time; however, the useable time may be obtained by computing the remaining service life at the time of computation, and using the remaining service life in conjunction with the average consumed service life and average use time.

What is claimed is:

1. A method for determining a service life of a secondary battery subjected to repeated charging/discharging cycles; comprising the steps of:

storing, in a memory device, pre-measured values of an index related to decrements in service life of the battery, which is fully charged after each discharge event during a charging/discharging cycle, to correspond to discharged amounts produced during charging/discharging cycles experienced by the battery during the respective charging/discharging cycles;

computing a discharged amount after each charging/discharging cycle;

obtaining an index to correspond to the discharged amount from said memory device;

computing a service life remaining after the current cycle of charging/discharging according to a maximum service life of the battery and the values of the index obtained in individual charging/discharging cycles, including the current charging/discharging cycle; and determining whether or not the remaining service life computed is less than a pre-determined reference value, and deeming that the battery has reached an end of the service life when the computed value is less than the reference value.

2. A method for determining a service life of a secondary subjected to repeated charging and discharging processes, comprising the steps of:

storing, in a memory device, pre-measured values of an index related to decrements in service life of the battery and various amounts of charges and discharges produced in charging/discharging cycles corresponding to the charged and discharged amounts experienced by the battery during the respective charging/discharging cycles;

computing a charged amount and a discharged amount after each cycle of charging/discharging;

obtaining an index to correspond to the computed charged amount and the computed discharged amount with reference to said memory device;

computing a service life remaining after the current cycle of charging/discharging according to a maximum service life of the battery and the values of the index obtained in individual charging/discharging cycles, including the current charging/discharging cycle; and determining whether or not the remaining service life computed is less than a pre-determined reference value, and deeming that the battery has reached an end of the service life when the computed service life is less than the reference value.

3. A method for determining a useable time for one additional use, after a current cycle of charging/discharging of a secondary battery subjected to repeated cycles of charging/discharging, comprising the steps of:

computing a service life of the battery remaining after the current cycle of charging/discharging of the battery;

computing an average amount of consumed service life by dividing a cumulative value of consumed service life of individual cycles from a first cycle to the current cycle of charging/discharging by a number of cycles of charging/discharging;

computing an average use time of the battery from the first cycle to the current cycle; and computing a useable time for one additional use of the battery after the current cycle of charging/discharging, according to the remaining service life computed, the average amount of consumed service life, and the average use time of the battery.

4. A method according to claim 3, wherein said remaining service life of the battery is obtained by subtracting a cumulative consumed service life including the current cycle of charging/discharging from the maximum service life of the battery.

5. A method according to claim 3, wherein said remaining service life of the battery is obtained by:

storing, in a memory device, pre-measured values of an index related to decrements in service life of the battery, which is fully charged after each discharge event during a charging/discharging cycle, to correspond to discharged amounts produced during charging/discharging cycles experienced by the battery during the respective charging/discharging cycles;

computing a first cumulative discharged amount from individual cycles of charging/discharging including a preceding cycle of charging/discharging of the battery;

obtaining a value of the index with reference to said memory device to correspond to the first cumulative discharged amount from individual cycles of charging/discharging including the preceding cycle;

computing a first service life of the battery remaining after the preceding cycle of charging/discharging, according to the maximum service life of the battery and the values of the index obtained from individual cycles of charging/discharging including the preceding cycle of charging/discharging of the battery;

computing a second cumulative discharged amount from individual cycles of charging/discharging including a current cycle of charging/discharging of the battery;

obtaining another value of the index with reference to said memory device to correspond to the second cumulative discharged amount from individual cycles of charging/discharging including the current cycle;

computing a second service life of the battery remaining after the current cycle of charging/discharging, according to the maximum service life of the battery and the values of the index obtained from individual cycles of charging/discharging including the current cycle of charging/discharging of the battery; and obtaining said remaining service life of the battery by subtracting said first cumulative service life from said second cumulative service life.

6. A method according to claim 3, wherein said remaining service life of the battery is obtained by:

storing, in a memory device, pre-measured values of an index related to decrements in service life of the battery and various amounts of charges and discharges produced in charging/discharging cycles corresponding to the charged and discharged amounts experienced by the battery during the respective charging/discharging cycles;

computing a charged amount and a discharged amount after each cycle of charging/discharging;

computing a first cumulative charged amount and a first cumulative discharged amount from individual cycles of charging/discharging including a preceding cycle of charging/discharging of the battery;

obtaining an index with reference to said memory device to correspond to the first cumulative charged amount and the first cumulative discharged amount from individual cycles of charging/discharging including the preceding cycle;

computing a first service life of the battery remaining after the preceding cycle of charging/discharging, according to the maximum service life of the battery and the values of the index obtained from individual cycles of charging/discharging including the preceding cycle of charging/discharging of the battery;

computing a second cumulative charged amount and the second cumulative discharged amount from individual cycles of charging/discharging including a current cycle of charging/discharging of the battery;

obtaining an index with reference to said memory device to correspond to the second cumulative charged amount and the second cumulative discharged amount from individual cycles of charging/discharging including the current cycle;

computing a second service life of the battery remaining after the current cycle of charging/discharging, according to the maximum service life of the battery and the values of the index obtained for individual cycles of charging/discharging including the current cycle of charging/discharging of the battery; and obtaining said remaining service life of the battery by subtracting said first service life from said second service life.

7. An apparatus for determining a service life of a secondary battery subjected to repeated cycles of charging/discharging of the battery, comprising:

first memory unit which stores values of an index related to decrements in service life of the battery, which is after each discharge event during a charging/discharging cycle, and various discharged amounts produced in charging/discharging cycles so as to correspond to discharged amounts experience by the battery in charging/discharging cycles;

first discharged amount computation unit which computes a discharged amount for each cycle of charging/discharging;

first index obtaining unit which obtains an index to correspond to a discharged amount computed by said first discharged amount computation unit with reference to the first memory unit;

computing a service life remaining after the current cycle of charging/discharging according to a maximum service life of the battery and the values of the index obtained in individual charging/discharging cycles, including the index obtained in the current charging/discharging cycle; and first determination unit which determines whether or not the remaining service life computed is less than a pre-determined reference value, and deeming that the battery has reached an end of the service life when the computed service life is less than the reference value.

8. An apparatus for determining a service life of a secondary battery subjected to repeated cycles of charging/discharging of the battery, comprising:

second memory unit which stores, in a memory device, pre-measured values of an index related to decrements in service life of the battery and various amounts of charges and discharges produced in charging/discharging cycles corresponding to the charged and discharged amounts experienced by the battery during the respective charging/discharging cycles; computing a charged amount and a discharged amount after each cycle of charging/discharging;

first charged/discharged amount computation unit which computes a charged amount and a discharged amount for each cycle of charging/discharging;

second index obtaining unit which obtains an index to correspond to a charged amount and a discharged amount computed by said first charged/discharged amount computation unit with reference to the second memory unit;

second service life computation unit which computes a remaining service life of the battery after the current cycle of charging/discharging according to the maximum service life of the battery and the index obtained by said second index obtaining unit from individual cycles of charging/discharging including current cycle of charging/discharging; and second determination unit which determines whether or not the remaining service life computed is less than a pre-determined reference value, and deeming that the battery has reached an end of the service life when the computed service life is less than the reference value.

9. An apparatus for determining a useable time for one additional use, after a current cycle of charging/discharging of a secondary battery subjected to repeated cycles of charging/discharging, comprising:

service life computation unit which computes a service life of the battery remaining after the current cycle of charging/discharging of the battery;

average service life computation unit which computes an average amount of consumed service life by dividing a cumulative value of consumed service life of individual cycles from a first cycle to the current cycle of charging/discharging by a number of cycles of charging/discharging;

average use time computing unit which computes an average use time of the battery from the first cycle to the current cycle; and useable time computation unit which computes a useable time for one additional use of the battery after the current cycle of charging/discharging, according to the remaining service life computed, the average amount of consumed service life, and the average use time of the battery.

10. An apparatus according to claim 9, wherein said remaining service life computed by the remaining service life computation unit is obtained by subtracting from the maximum service life of the battery a cumulative consumed service life in individual cycles of charging/discharging from the first use to the current use.

11. An apparatus according to claim 9, wherein said service life decrement computation unit comprises:

third memory unit which stores, in a memory device, pre-measured values of an index related to decrements in service life of the battery, which is fully charged after each discharge event during a charging/discharging cycle, to correspond to discharged amounts produced during charging/discharging cycles experienced by the battery during the respective charging/discharging cycles;

second discharged amount computation unit which computes a discharged amount for each cycle of charging/discharging;

third index obtaining unit which obtains an index to correspond to a discharged amount computed by said second discharged amount computation unit with reference to the third memory unit; and first differential outputting unit which outputs a difference between a service life remaining in the battery after the preceding cycle of charging/discharging computed according to the maximum service life of the battery and the values of the index obtained by said third index obtaining unit for individual cycles of charging/discharging including the preceding cycle of discharge, on the one hand, and a service life remaining in the battery after the current cycle of charging/discharging computed according to the maximum service life of the battery and the values of the index obtained by said third index obtaining unit for individual cycles of charging/discharging including the current cycle of discharge, on the other.

12. A useable time computation apparatus according to claim 9, wherein said service life decrement computation unit comprises:

fourth memory unit which stores pre-measured values of an index related to decrements in service life of the battery and various amounts of charges and discharges produced in charging/discharging cycles corresponding to the charged and discharged amounts experienced by the battery during the respective charging/discharging cycles;

computing a charged amount and a discharged amount after each cycle of charging/discharging;

fourth index obtaining unit which obtains an index to correspond to a discharged amount computed by said second discharged amount computation unit with reference to the fourth memory unit; and second differential outputting unit which outputs a difference between a service life remaining in the battery after the preceding cycle of charging/discharging computed according to the maximum service life of the battery and the values of the index obtained by said fourth index obtaining unit for individual cycles of charging/discharging including the preceding cycle of discharge, on the one hand, and a service life remaining in the battery after the current cycle of charging/discharging computed according to the maximum service life of the battery and the values of the index obtained by said fourth index obtaining unit for individual cycles of charging/discharging including the current cycle of discharge, on the other.

13. A computer-readable recorded medium containing a program for determining a service life of a secondary battery according to claim 1.

14. A computer-readable recorded medium containing a program for determining a service life of a secondary battery according to claim 2.

15. A computer-readable recorded medium containing a program for determining a service life of a secondary battery according to claim 3.

16. A computer-readable recorded medium containing a program for determining a service life of a secondary battery according to claim 7.

17. A computer-readable recorded medium containing a program for determining a service life of a secondary battery according to claim 8.

18. A computer-readable recorded medium containing a program for determining a service life of a secondary battery according to claim 9.

* * * * *